US010290542B2

(12) United States Patent
Nakatani

(10) Patent No.: US 10,290,542 B2
(45) Date of Patent: May 14, 2019

(54) METHOD OF MANUFACTURING SEMICONDUCTOR DEVICE

(71) Applicant: HITACHI KOKUSAI ELECTRIC INC., Tokyo (JP)

(72) Inventor: Kimihiko Nakatani, Toyama (JP)

(73) Assignee: Kokusai Electric Corporation, Tokyo (JP)

( * ) Notice: Subject to any disclaimer, the term of this patent is extended or adjusted under 35 U.S.C. 154(b) by 0 days.

(21) Appl. No.: 15/922,291

(22) Filed: Mar. 15, 2018

(65) Prior Publication Data

US 2018/0204768 A1 Jul. 19, 2018

Related U.S. Application Data

(63) Continuation of application No. PCT/JP2015/077501, filed on Sep. 29, 2015.

(51) Int. Cl.

| | |
|---|---|
| ***H01L 21/00*** | (2006.01) |
| ***H01L 21/768*** | (2006.01) |
| ***H01L 21/285*** | (2006.01) |
| ***C23C 16/34*** | (2006.01) |
| ***C23C 16/44*** | (2006.01) |
| ***C23C 16/455*** | (2006.01) |
| ***C23C 16/52*** | (2006.01) |
| ***H01L 21/02*** | (2006.01) |
| ***C23C 16/04*** | (2006.01) |
| ***C23C 16/14*** | (2006.01) |

(52) U.S. Cl.

CPC ...... *H01L 21/76876* (2013.01); *C23C 16/045* (2013.01); *C23C 16/14* (2013.01); *C23C 16/34* (2013.01); *C23C 16/4408* (2013.01); *C23C 16/4412* (2013.01); *C23C 16/455* (2013.01); *C23C 16/45527* (2013.01); *C23C 16/45546* (2013.01); *C23C 16/52* (2013.01); *H01L 21/02271* (2013.01); *H01L 21/285* (2013.01)

(58) Field of Classification Search

CPC ........... H01L 21/02271; H01L 21/0228; H01L 21/02274; H01L 21/02172

See application file for complete search history.

(56) References Cited

U.S. PATENT DOCUMENTS

| | | | | |
|---|---|---|---|---|
| 5,182,221 | A * | 1/1993 | Sato | H01L 21/02164 148/DIG. 118 |
| 6,596,654 | B1 * | 7/2003 | Bayman | C23C 16/045 257/E21.268 |
| 2019/0057858 | A1 * | 2/2019 | Hausmann | H01L 21/0228 |

* cited by examiner

*Primary Examiner* — Richard A Booth
(74) *Attorney, Agent, or Firm* — Volpe and Koenig, P.C.

(57) ABSTRACT

Described herein is a technique capable of forming a film having excellent step coverage and superior filling properties. According to the technique, there is provided a method of manufacturing a semiconductor device including: (a) preparing a substrate provided with a groove having thereon a base film selected from a group consisting of a metal nitride film and an insulating film; and (b) performing a cycle a predetermined number of time to selectively form a first metal film at a lower portion of the groove with the base film at an upper portion of the groove exposed, the cycle including: (b-1) supplying a first reducing gas to the substrate; and (b-2) supplying a first metal-containing gas to the substrate, wherein (b-1) an (b-2) are non-simultaneously performed, and a supply condition of the first reducing gas in (b-1) is adjusted according to am aspect ratio of the groove.

12 Claims, 12 Drawing Sheets

312, 322, 332
512, 522, 532
MASS FLOW CONTROLLERS
314, 324, 334
514, 524, 534
VALVES
245
PRESSURE SENSOR
243
APC VALVE
246
VACUUM PUMP
207
HEATER
263
TEMPERATURE SENSOR
267
ROTATING MECHANISM
115
BOAT ELEVATOR
121a
CPU
121b
RAM
121c
MEMORY DEVICE
121d
I/O PORT
121
123
EXTERNAL MEMORY DEVICE
122
INPUT/OUPUT DEVICE

1ST PROCESS
2ND PROCESS
1ST CYCLE
2ND CYCLE
nTH CYCLE
FIRST REDUCING GAS
SOURCE GAS
SECOND REDUCING GAS
INERT GAS

BASE FILM
1$^{ST}$ W FILM
2$^{ND}$ W FILM

BASE FILM
1$^{ST}$ W FILM
2$^{ND}$ W FILM

BASE FILM
1$^{ST}$ W FILM
2$^{ND}$ W FILM

METHOD OF MANUFACTURING SEMICONDUCTOR DEVICE

CROSS-REFERENCE TO RELATED PATENT APPLICATION

This non-provisional U.S. patent application, claims priority under 35 U.S.C. § 119 of International Application No. PCT/JP2015/077501, filed on Sep. 29, 2015, in the WIPO, the entire contents of which are hereby incorporated by reference.

BACKGROUND

1. Field

The present disclosure relates to a method of manufacturing, a semiconductor device.

2. Description of the Related Art

According to a recent process fox manufacturing a large scale integrated circuit (LSI), a device becomes more miniaturized and complicated. In the process for manufacturing the LSI, a conductive metal thin film is formed by a chemical vapor deposition (CVD) method having excellent step coverage or a method of alternately supplying source gas.

As the device is miniaturized, the width of the space in which the metal film is formed becomes smaller. Therefore, better step coverage or filling characteristics is required.

SUMMARY

According to the technique described herein, a film having excellent step coverage and superior filling properties may be formed.

According to one aspect of the technique described herein, there is provided a method of manufacturing a semiconductor device including: (a) preparing a substrate provided with a groove having thereon a base film selected from a group consisting of a metal nitride film and an insulating film; and (b) performing a cycle a predetermined number of time to selectively form a first metal film at a lower portion of the groove with the base film at an upper portion of the groove exposed, the cycle including: (b-1) supplying a first reducing gas to the substrate; and (b-2) supplying a first metal-containing gas to the substrate, wherein (b-1) and (b-2) are non-simultaneously performed, and a supply condition of the first reducing gas in (b-1) is adjusted according to am aspect ratio of the groove.

DETAILED DESCRIPTION

Embodiment

Hereinafter, an embodiment will be described with reference to FIG. 1 trough 3.

(1) Configuration of Substrate Processing Apparatus

Figure 1:
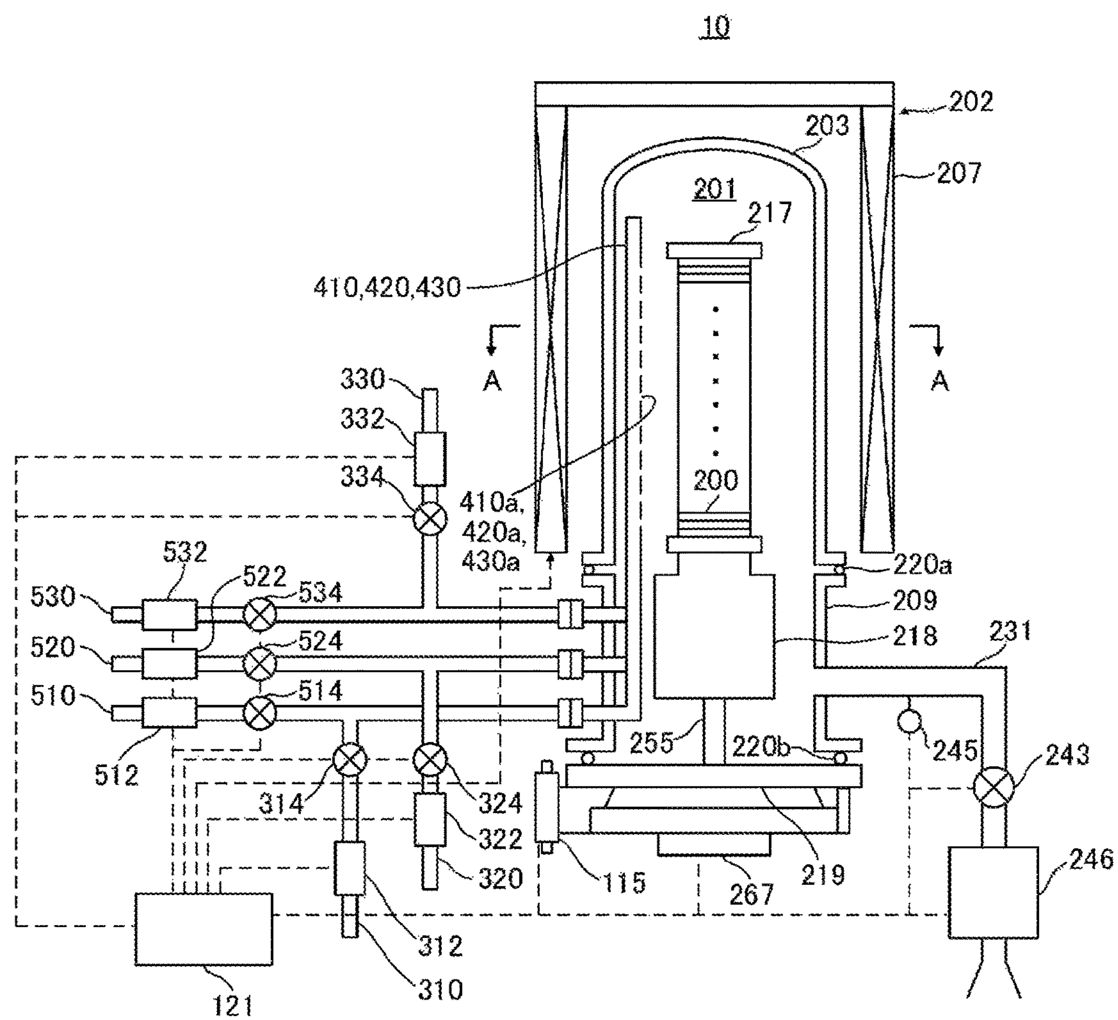
FIG. 1 schematically illustrates a vertical cross-section of a vertical type processing furnace of a substrate processing apparatus preferably used in an embodiment described herein.

As illustrated in FIG. 1, a processing furnace 202 includes a heater 207 serving as a heating mechanism (temperature adjusting mechanism). The heater 207 is cylindrical, and provided in vertical orientation while being supported by a heater base serving as a support plate (not shown). The heater 207 also functions as an activation mechanism (excitation mechanism) for activating (exciting) a gas by heat which will be described later.

A reaction tube 203 is provided in and concentric with the heater 207. The reaction tube 203 is made of a heat-resistant material such as quartz ($SiO_2$) and silicon carbide (SiC), and cylindrical with a closed upper end and an open lower end. A manifold (inlet flange) 209 is provided under and concentric with the reaction tube 203. The manifold 209 is made of a metal such as stainless steel (SUS), and cylindrical with open upper and lower ends. The upper end of the manifold 209 is engaged with the lower end of the reaction tube 203 so as to support the reaction tube 203. An O-ring (sealing member) 220*a* is provided between, the manifold 209 and die reaction tube 203. The reaction tube 203 is provided in vertical orientation with the manifold 209 thereunder supported by the heater base (not shown). A processing vessel (reaction vessel) is constituted by the reaction tube 203 and the manifold 209. A process chamber 201 is provided in the hollow cylindrical portion of the processing vessel.

The process chamber 201 is capable of accommodating wafers (substrates) 200. A boat 217 supporting the wafers 200 vertically arranged in multiple stages while the wafers 200 being in horizontal orientation is accommodated in the process chamber 201.

Nozzles 410, 420 and 430 are provided in the process chamber 201 through sidewalls of the manifold 209. Gas supply pipes 510, 520 and 530 are connected to the nozzles 410, 420 and 430, respectively, such that different gases from the gas supply pipes 510, 520 and 530 can be supplied into the process chamber 201 via the nozzles 410, 420 and 430, respectively.

MFCs (Mass Flow Controllers) 512, 522 and 532 serving as flow rate controllers (flow rate control mechanisms) and valves (opening/closing valves) 514, 524 and 534 are sequentially provided at the gas supply pipes 510, 520 and 530 from the upstream sides toward the downstream sides of the gas supply pipes 510, 520 and 530, respectively. Gas supply pipes 310, 320 and 330 for supplying an inert gas are connected to the downstream sides of the valves 514, 524 and provided at the gas supply pipes 510, 520 and 530, respectively. MFCs 312, 322 and 332 serving as flow rate controllers (flow rate control mechanisms) and valves (opening/closing valves) 314, 324 and 334 are sequentially provided at the gas supply pipes 310, 320 and 330 front the upstream sides toward the downstream sides of the gas supply pipes 310, 320 and 330, respectively.

Figure 2:
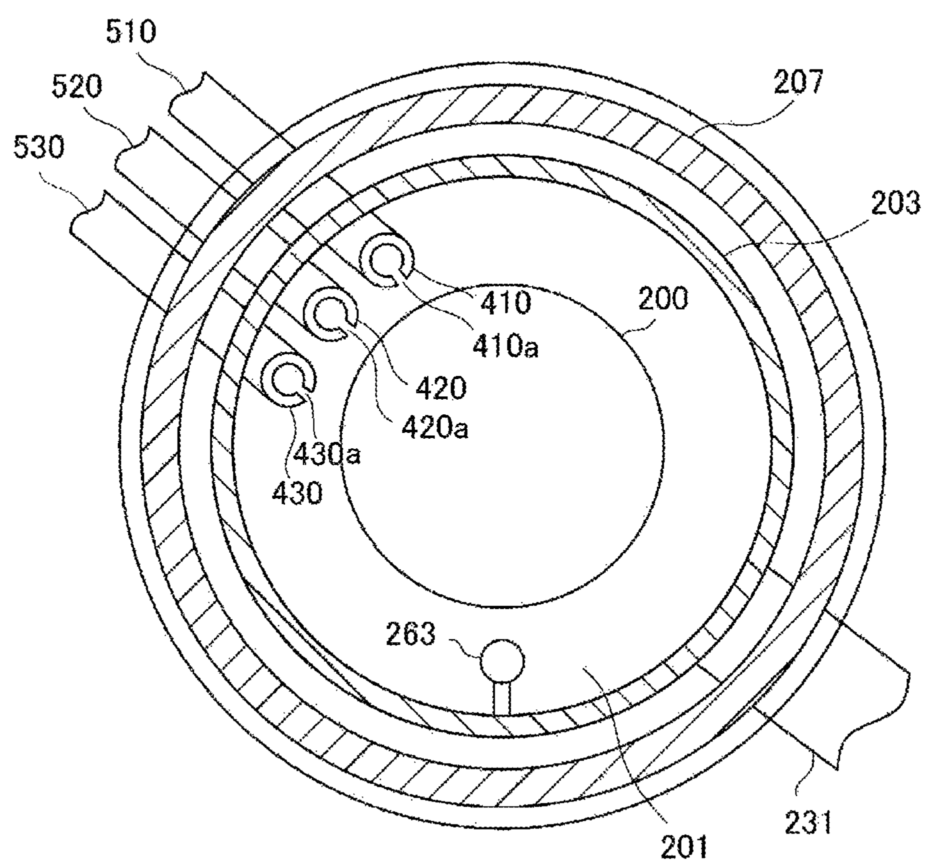
FIG. 2 schematically illustrates a cross-section taken along the line A-A of the vertical type processing furnace of the substrate processing apparatus shown in FIG. 1.

The nozzles 410, 420 and 430 are connected to the downstream sides of the gas supply pipes 510, 520 and 530, respectively. As shown in FIG. 2, the nozzles 410, 420 and 430 are provided in an annular space between the inner wall of the reaction tube 203 and the wafers 200, and extend from bottom to top of the inner wall of the reaction tube 203 along the stacking direction of the wafers 200. Specifically, the nozzles 410, 420 and 430 are provided in a region that horizontally surrounds a wafer arrangement region where the wafers 200 are arranged. That is, the vertical portions of the nozzles 410, 420 and 430 are disposed at one side of the edge of the wafer 200 perpendicular to the top surface of the wafer 200 accommodated in the process chamber 201. The nozzles 410, 420 and 430 include L-shaped long nozzles, and horizontal portions thereof penetrate the sidewalk of the manifold 209, and vertical portions thereof extend at least from a lower end to an upper end of the wafer arrangement region. A plurality of gas supply holes 410*a*, a plurality of gas supply holes 420*a* and a plurality of gas supply holes 430*a* for supplying gases are provided at side surfaces of the nozzles 410, 420 and 430, respectively. The plurality of gas supply holes 410*a*, 420*a* and 430*a* are open toward the center of the reaction tube 203, and configured to supply gases toward the wafers 200. The plurality of gas supply boles 410*a*, the plurality of gas supply holes 420*a* and the plurality of gas supply boles 430*a* are provided to face the lower portion through the upper portion of the reaction tube 203. Each of the plurality of gas supply holes 410*a*, 420*a* and 430*a* have the same area and pitch.

According to the embodiment, gas is supplied through the nozzles 410, 420 and 430 disposed in the vertical annular space defined by the inner surface of the sidewall of the reaction tube 230 and the edges of the wafers 200 arranged in the reaction tube 203. The gas is injected into the reaction tube 203 toward the wafers 200 through the gas supply holes 410*a*, 420*a* and 430*a* of the nozzles 410, 420 and 430, respectively. The gas injected into the reaction tube 203 mainly flows parallel to the surface of the wafers 200, that is, horizontally to uniformly supply the gas to each of the wafers 200 and form films with uniform thickness on the wafers 200. After passing the surface of the wafers 200, the gas flows toward an exhaust port, that is, an exhaust pipe 231. However, the flow direction of the gas may vary depending on the location of the exhaust port, and is not limited to the vertical direction.

A halogen-based source (also referred to as "first source" or simply "source") such as a halogen-based tungsten source gas containing tungsten and halogen as main elements is supplied into the process chamber 201 via the MFC 512 and the valve 514 which are provided at the gas supply pipes 510, and the nozzle 410.

The halogen-based source includes a halogen group such as chloro group, fluoro group, bromo group and iodo group. That is, the halogen group includes a halogen such as chlorine (Cl), fluorine (F), bromine (Br) and iodine (I). The halogen-based source may be considered as a halide.

For example, a source gas containing tungsten and fluorine, i.e., a fluoro tungsten source gas may be used as the halogen-based tungsten source gas. The fluoro tungsten source gas acts as a tungsten source in the film-forming process which will be described later. For example, the fluoro tungsten source gas includes tungsten fluoride ($WF_6$) gas.

A first reducing gas (also referred to as "first reducing agent") is supplied into the process chamber 201 via the MFC 522 and the valve 524 which are provided at the gas supply pipe 520, and the nozzle 420. For example, the first reducing gas includes a gas containing boron (B) (also referred to as "boron-containing gas") such as diborane ($B_2H_6$) gas.

A second reducing gas (also referred to as "second reducing agent") is supplied into the process chamber 201 via the MFC 532 and the valve 534, which are provided at the gas supply pipe 530, and the nozzle 430. For example, the second reducing gas includes a gas containing hydrogen (H) (also referred to as "hydrogen-containing gas") such as hydrogen ($H_2$) gas.

An inert gas such as $N_2$ gas is supplied into the process chamber 201 via the MFCs 312, 322 and 332 and the valves 314, 324 and 334, which are provided at the gas supply pipe 310, 320 and 330, respectively, and the nozzles 410, 420 and 430.

Herein, the term "source gas" or "reducing gas" refers to a source or reducing agent in gaseous state, for example, a gas obtained by: vaporizing the source or the reducing agent in liquid state; vaporizing a solution of the source or the reducing agent; or subliming the source or the reducing agent in solid state, or a source or reducing agent which is naturally in gaseous state at room temperature and normal pressure. Herein, the term "source" refers to "source gas," "source in liquid state", "source in solid state," or combinations thereof. Herein, the term "liquid source" refers to: a source in a liquid state at room temperature and under normal pressure; a solution of a source in solid state at room temperature and under normal pressure by dissolving the source in powder form; or both. Herein, the term "reducing agent" refers to "reducing agent in liquid state," "reducing agent in solid state," "reducing gas in gaseous state," or combinations thereof. When a source in liquid state or in solid state at room temperature and under normal pressure is used, the source is vaporized or sublimed by a system such as a vaporizer, bubbler and sublimator before supplied.

In case the source gas is supplied via the gas supply pipe 510, a source gas supply system is constituted by the gas supply pipe 510, the MFC 512 and the valve 514. The source gas supply system may further include the nozzle 410. The source gas supply system may also be referred to as "source supply system." In case a metal-containing gas is supplied via the gas supply pipe 510 as the source gas, the source gas supply system may also be referred to as "metal-containing gas supply system." In case a tungsten-containing gas via the gas supply pipe 510 as the source gas, the source gas supply system may also be referred to as "tungsten-containing gas supply system." In case a $WF_6$-containing gas is supplied via the gas supply pipe 510 as the source gas, the tungsten-containing gas supply system may also be referred to as "$WF_6$ gas supply system." The $WF_6$ gas supply system may also be referred to as "$WF_6$ supply system."

In case the first reducing gas is supplied via the gas supply pipe 520 as the reducing agent, a first reducing gas supply system is constituted by the gas supply pipe 520, the MFC 522 and the valve 524. The first reducing gas supply system may further include the nozzle 420. The first reducing gas supply system may also be referred to as "first reducing agent supply system." In case the boron-containing gas is supplied via the gas supply pipe 520 as the first reducing gas, the first reducing gas supply system may also be referred to as "boron-containing gas supply system." In case the $B_2H_6$ gas is supplied via the gas supply pipe 520 as the first reducing gas, the boron-containing gas supply system may also be referred to as "$B_2H_6$ gas supply system" or "$B_2H_6$ supply system."

In case the second reducing gas is supplied via the gas supply pipe 530 as the reducing agent, a second reducing gas supply system is constituted by the gas supply pipe 530, the MFC 532 and the valve 534. The second reducing gas supply system may further include the nozzle 430. The second reducing gas supply system may also be referred to as "second reducing agent supply system." In case the hydrogen-containing gas is supplied via the gas supply pipe 530 as the second reducing gas, the second reducing gas supply system may also be referred to as "hydrogen-containing gas supply system." In case the $H_2$ gas is supplied via the gas supply pipe 530 as the second reducing gas, the hydrogen-containing gas supply system may also be referred to as "$H_2$ gas supply system" or "$H_2$ supply system."

An inert gas supply system is constituted by the gas supply pipes 310, 320 and 330, the MFCs 312, 322 and 332 and the valves 314, 324 and 334.

A supply system is constituted by the source gas supply system, the first reducing gas supply system and the second reducing gas supply system. The supply system may further include the inert gas supply system.

An exhaust pipe 231 for exhausting the inner atmosphere of the process chamber 201 is provided at the manifold 209. A vacuum pump 246, which is a vacuum exhaust mechanism, is connected to the exhaust pipe 231 via a pressure sensor 245 and an APC (Automatic Pressure Controller) valve 243. The pressure sensor 245 serves as a pressure detector (pressure detection mechanism) which detects the inner pressure of the process chamber 201, and the APC valve 243 serves as a pressure controller (pressure adjusting mechanism). With the vacuum pump 246 in operation, the APC valve 243 may be opened/closed to vacuum-exhaust the process chamber 201 or stop the vacuum exhaust. With the vacuum pump 246 in operation, the opening degree of the APC valve 243 may be adjusted based on the pressure detected by the pressure sensor 245 in order to control the inner pressure of the process chamber 201. The exhaust pipe 231, the APC valve 243 and the pressure sensor 245 constitutes an exhaust system. The exhaust system may further include the vacuum pump 246.

A seal cap 219, which is a furnace opening cover capable of airtightly sealing the lower end opening of the manifold 209, is provided under the manifold 209. The seal cap 219 is provided under the manifold 209 and is in contact with the lower end of the manifold 209. The seal cap 219 is made of metal such as SUS, and is a disk-shaped. An O-ring (sealing member) 220*b* is provided on the upper surface of the seal cap 219 and is in contact with the lower end of the manifold 209. A rotating mechanism 267 configured to rotate the boat 217 is provided at the seal cap 219 opposite to the process chamber 201 with respect to the seal cap 219. A rotating shaft 255 of the rotating mechanism 267 is connected to the boat 217 through the seal cap 219. As the rotating mechanism 267 rotates the boat 217, the wafers 200 charged in the boat 217 are rotated. The seal cap 219 may be moved up and down by a boat elevator 115, which is an elevating mechanism provided outside the reaction tube 203. As the seal cap 219 is moved up and down by the boat elevator 115, the boat 217 may be loaded into the process chamber 201 or unloaded from the process chamber 201. The boat elevator 115 serves as a transport apparatus (transport mechanism) for transporting the boat 217, that is, the wafers 200, into the process chamber 201 or out of the process chamber 201.

The boat 217, which is a substrate retainer, supports concentrically arranged wafers 200 (e.g. 25 to 200 wafers 200) in vertical direction while each of the wafers 200 are in horizontal orientation. That is, the boat 217 supports, in multiple stages, concentrically arranged the wafers 200 with a predetermined interval therebetween. The boat 217 is made of a heat-resistant material such as quartz and SiC. An insulating cylinder 218 is a cylindrical member made of a heat-resistant material such as quartz and SiC, and provided under the boat 217. The insulating cylinder 218 suppresses the transmission of heat from the beater 207 to the seal cap 219. However, the embodiment is not limited to the above-described configuration. For example, insulating plates (not shown) made of a heat-resistant material such as quartz and SiC may be provided under the boat 217 instead of the insulating cylinder 218.

A temperature sensor (temperature detector) 263 is provided in the reaction tube 203. The energization state of the heater 207 is controlled based on the temperature detected by the temperature sensor 263 such that the inner temperature of the process chamber 201 has a desired temperature distribution. Similar to the nozzles 410, 420 and 430, the temperature sensor 263 is L-shaped, and pro vided along the inner wall of the reaction tube 203.

Figure 3:
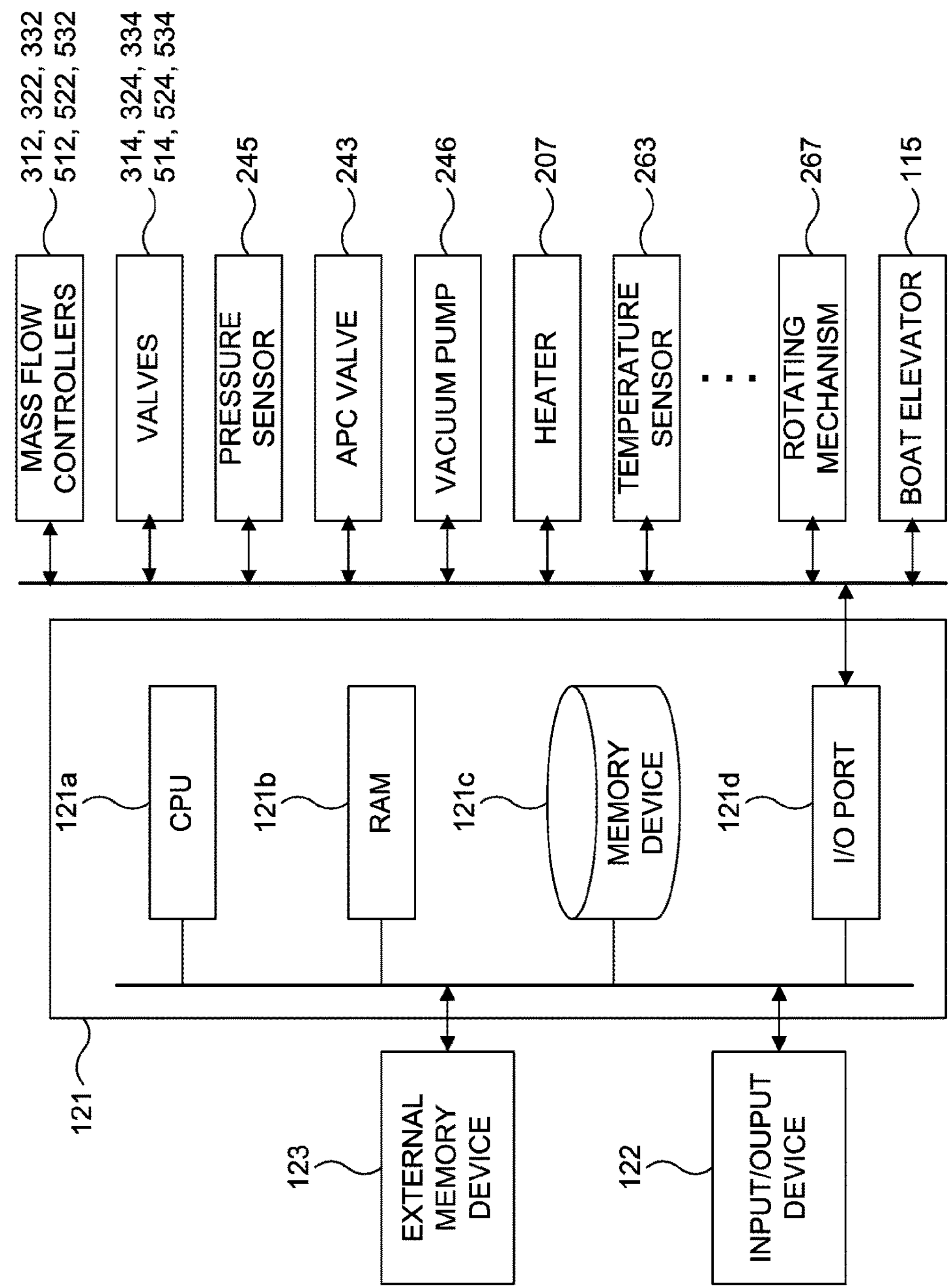
FIG. 3 is a block diagram schematically illustrating a configuration of a controller and components controlled by the controller of the substrate processing apparatus preferably used in the embodiment.

As shown in FIG. 3, the controller 121, which is a control device (control means), is embodied by a computer including a CPU (Central Processing Unit) 121*a*, a RAM (Random Access Memory) 121*b*, a memory device 121*c* and an I/O port 121*d*. The RAM 121*b*, the memory device 121*c* and the I/O port 121*d* may exchange data with the CPU 121*a* through an internal bus. For example, an input/output device 122 such as a touch panel is connected to the controller 121.

The memory device 121*c* is embodied by components such as a flash memory and HDD (Hard Disk Drive). A control program for controlling the operation, of the substrate processing apparatus or a process recipe containing information on the sequence and conditions of a film-forming process described later is readably stored in the memory device 121*c*. The process recipe is obtained by combining steps of the film-forming process described later such that the controller 121 may execute the steps to acquire a predetermine result, and functions as a program. Hereafter, the process recipe and the control program are collectively referred to as "program." The process recipe may also simply be referred to as "recipe/" Herein, "program" may indicate only die process recipe, only the control program, or both. The RAM 121*b* is a work, area where a program or data read by the CPU 121*a* is temporarily stored.

The I/O port 121*d* is connected to the above-described components such as the mass flow controllers (MFCs) 312, 322, 332, 512, 522 and 532, the valves 314, 324, 334, 514, 524 and 534, the APC valve 243, the pressure sensor 245, the vacuum pump 246, the heater 207, the temperature sensor 263, the rotating mechanism 267 and the boat elevator 115.

The CPU 121*a* is configured to read the control program from the memory device 121*c* and execute the control program. Furthermore, the CPU 121*a* is configured to read the process recipe from the memory device 121*c* according to an operation command inputted from the input/output device 122. According to the contents of the process recipe, the CPU 121*a* may be configured to control various operations such as flow rate adjusting operations of various gases by the MFCs 312, 322, 332, 512, 522 and 532, opening/closing operations of the valves 314, 324, 334, 514, 524 and 534, an opening/closing operation of the APC valve 243, a pressure adjusting operation by the APC valve 243 based on the pressure detected by the pressure sensor 245, a temperature adjusting operation of the heater 207 based on the temperature detected by the temperature sensor 263, a start and stop of the vacuum pump 246, a rotation and a rotation speed adjusting operation of the boat 217 by the rotating mechanism 267 and an elevating operation of the boat 217 by the boat elevator 115.

The controller 121 may be embodied by installing, onto a computer, the above-described program stored in an external memory device 123 including a magnetic tape, a magnetic disk such as a flexible disk and a hard disk, an optical disk such as CD and DVD, a magneto-optical disk such as MO, and a semiconductor memory such as a USB memory and a memory card. The memory device 121*c* or the external memory device 123 may be embodied by a non-transitory computer readable recording medium. Hereinafter, the memory device 121*c* and the external memory device 123 are collectively referred to as "recording media." Herein, "recording media" may indicate only the memory device 121*c*, only the external memory device 123 or both. In addition to the external memory device 123, a communication network such as the Internet and dedicated line may be used as the unit for providing the program to a computer.

(2) Film-forming Process

Next, m example film-forming process, which is a substrate processing for manufacturing a semiconductor device, wherein a grove (trench) provided with a base film selected from a group consisting of metal nitride film and an insulating film is filled with a film using the substrate processing apparatus will be described with reference to FIG. 4. Herein, the components of the substrate processing apparatus are controlled by the controller 121.

Figure 4:
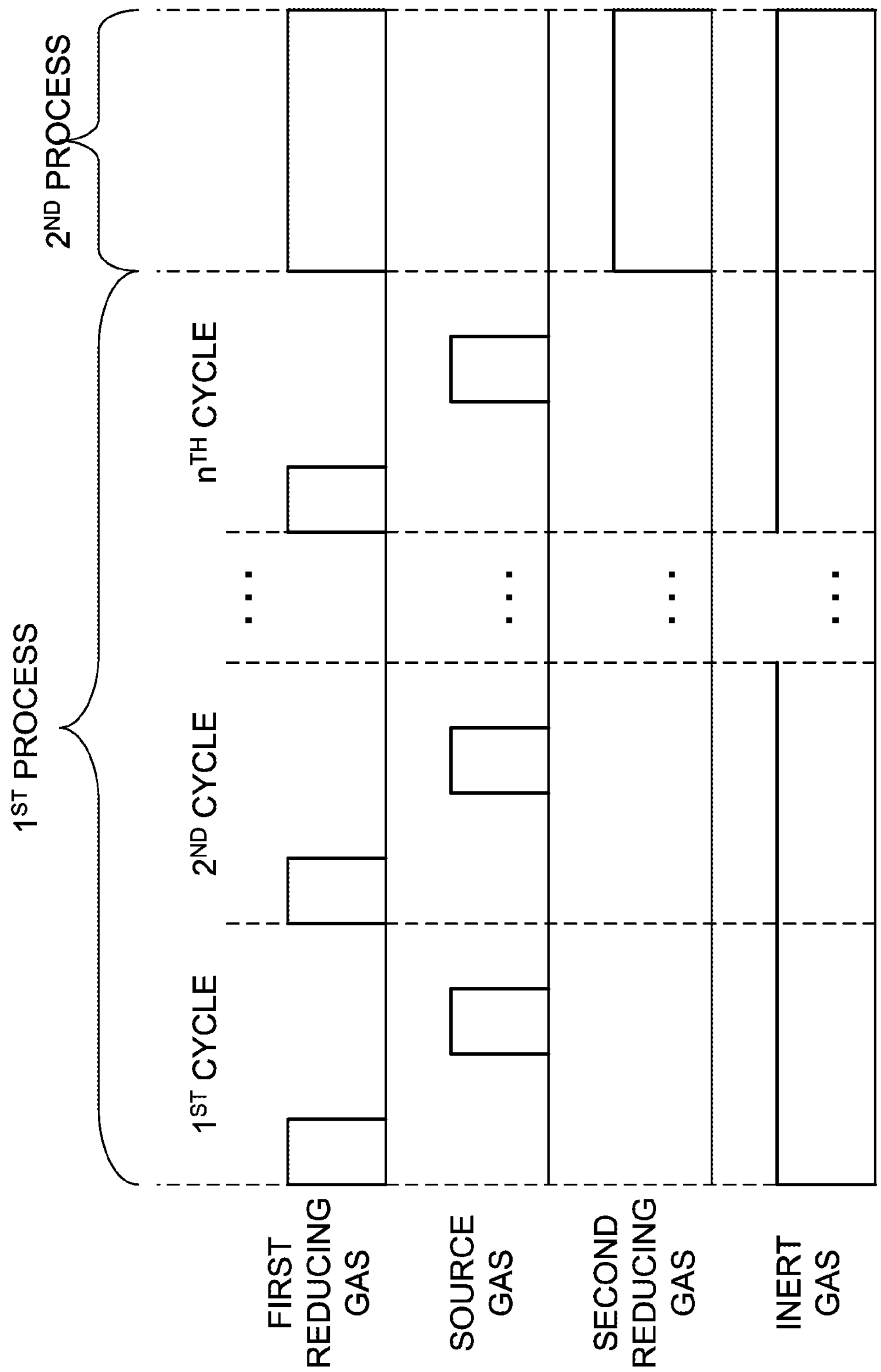
FIG. 4 is a timing diagram of a gas supply of the film-forming process according to the embodiment.

According to the film-forming step shown in FIG. 4, a first tungsten film (first tungsten film) is formed on the wafers 200 by performing a cycle a predetermined number of times (one or more times). The cycle includes non-simultaneously performing a first step wherein $B_2H_6$ gas is supplied onto the wafers 200 as the first reducing gas and a second step wherein $WF_6$ gas is supplied onto the wafers 200 as the source gas.

Hereinafter, the above-described film-forming step shown in FIG. 4 according to the embodiment may be represented as below:

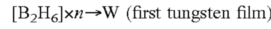

$[B_2H_6]\times n\rightarrow W$ (first tungsten film)

Modified examples and other embodiments, which will be described later, will be also represented in the same manner.

After the first tungsten film is formed, a second tungsten film (second tungsten film or film containing tungsten) is formed on the first tungsten film by supplying $WF_6$ gas as the source gas and $H_2$ gas as the second reducing gas. $WF_6$ gas and $H_2$ gas are at least in part supplied simultaneously represented as below

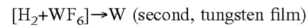

$[H_2+WF_6]\rightarrow W$ (second, tungsten film)

Herein, the term "W film" may refer to only the first tungsten film, only the second tungsten film or both.

The sequence shown in FIG. 4 wherein the second tungsten film is formed after the first tungsten film is formed may be represented as below.

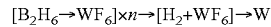

$[B_2H_6\rightarrow WF_6]\times n\rightarrow[H_2+WF_6]\rightarrow W$

Herein, the term "base film" may refer to only the metal nitride film, only the insulating film, or both.

Herein, the term "wafer" may refer to "wafer itself" or collectively refer to "stacked structure of wafer and layer or film formed on the surface thereof." The term "surface of wafer" may refer to "surface of wafer itself" or "surface of layer or film formed on the surface of wafer" (i.e. "top surface of the stacked structure").

Herein, "supplying a predetermined gas to a wafer" refers to "directly supplying a predetermined gas to a surface (exposed surface) of the wafer itself" or "supplying a predetermined gas to a layer or film formed on a wafer" (i.e. "supplying a predetermined gas to the top surface of the stacked structure"). Herein, "forming a predetermined layer (or film) on a wafer" refers to "forming a predetermined layer (or film) directly on the surface (exposed surface) of the wafer itself" or "forming a predetermined layer (or film) on the stacked structure" (i.e. "forming a predetermined layer (or film) on the top surface of the stacked structure").

Herein, the term "substrate" is used in the same sense as "wafer," and the term "wafer" may be replaced by "substrate."

<Substrate Preparation Step>

In the substrate preparation step, the boat 217 is charged with the wafers 200 (wafer charging). Referring to FIG. 1, the boat 217 charged with wafers 200 is lifted by the boat elevator 115 and loaded into the process chamber 201 (boat loading). With the boat 217 loaded, die seal cap 219 seals the lower end of the manifold 209 via the O-ring 220*b*.

<Pressure and Temperature Adjusting Step>

The vacuum pump 246 vacuum-exhausts (evacuates) the process chamber 201 such that the inner pressure of the process chamber 201, that is, the pressure of the space in which the wafers 200 are present is adjusted to a desired pressure (vacuum level). Simultaneously, the inner pressure of the process chamber 201 is measured by the pressure sensor 245, and the APC valve 243 is feedback-controlled based on the measured pressure (pressure adjusting). The vacuum pump 246 continuously vacuum-exhausts the process chamber 201 at least until the film-forming process described later is completed. The heater 207 heats the process chamber 201 such that the inner temperature of the process chamber 201 reaches a desired film-forming temperature. The energization state of the heater 207 is feedback-controlled based on the temperature detected by the temperature sensor 263 such that the inner temperature of the process chamber 201 has a desired temperature distribution. The heater 207 continuously heats the process chamber 201 at least until the film-forming process described later is completed. The rotating mechanism 267 starts to rotate the boat 217 and the wafers 200. The rotating mechanism 267 continuously rotates the boat 217 and the wafers 200 at least until the film-forming process described later is completed.

<Film-Forming Step>

Next, the film-forming step which includes sequentially performing the first sequence wherein the first tungsten film is formed and the second sequence wherein the second tungsten film is formed on the first film is performed.

<First Sequence>

In the first sequence, the first tungsten film (film containing tungsten) is formed on the waters 200 by performing a cycle a predetermined number of times (one or more times). The cycle includes non-simultaneously (asynchronously, intermittently or alternately) performing the first step wherein $B_2H_6$ gas is supplied onto the wafers 200 as the first reducing gas and the second step wherein $WF_6$ gas is supplied onto the wafers 200 as the source gas.

<First Step>

In the first step, a boron-containing film is formed on the wafers 200 in the process chamber 201 by supplying $B_2H_6$ gas onto the wafers 200

Specifically, the valve 524 is opened to supply the $B_2H_6$ gas into the gas supply pipe 520. After the flow rate of $B_2H_6$ gas is adjusted by the MFC 522, the $B_2H_6$ gas is supplied into the process chamber 201 and onto the wafers 200 through the gas supply pipe 520, the nozzle 420, and the plurality of gas supply holes, and then exhausted through the exhaust pipe 231. As a result, the surfaces of the wafers 200 are exposed to the $B_2H_6$ gas. Simultaneously, the valve 324 is opened to supply gas into the gas supply pipe 320. After the flow rate of $N_2$ gas is adjusted by the MFC 322 the $N_2$ gas is supplied along with the $B_2H_6$ gas into the process chamber 201, and then exhausted through the exhaust pipe 231.

In order to prevent the $B_2H_6$ gas from entering the nozzles 410 and 430, the valves 314 and 334 are opened to supply $N_2$ gas into the gas supply pipes 310 and 330. The $N_2$ gas is supplied into the process chamber 201 through the gas supply pipes 510 and 530 and the nozzles 410 and 430, and then exhausted through the exhaust pipe 231.

Simultaneously, the APC valve 243 is controlled to adjust the inner pressure of the process chamber 201. For example, the inner pressure of the process chamber 201 ranges from 1 Pa to 1,000 Pa, preferably from 50 to 500 Pa. When the inner pressure of the process chamber 210 is higher than 1,000 Pa, a residual gas may not be sufficiently removed at a first residual gas removing step described later. As a result, the uniformity of the film formation may be degraded. When the inner pressure of the process chamber 210 is lower than 1 Pa, $B_2H_6$ gas may diffuse excessively. As a result, the selective formation at the lower portion and the upper portion of groove which will be described later is degraded or sufficient film forming rate cannot be obtained. Herein, "from 1 Pa to 1,000 Pa." refers to "1 Pa or higher and 1,000 Pa or lower." That is, the range "from 1 Pa to 1,000 Pa" includes 1 Pa and 1,000 Pa. The same also applies to other numerical ranges herein such as flow rate, time and temperature.

For example, the flow rate of the $B_2H_6$ gas controlled by the MFC 522 ranges from 1 sccm to 15,000 sccm, preferably from 6,000 sccm to 10,000 sccm. When the flow rate of the $B_2H_6$ gas is higher than 15,000 sccm, the uniformity of the film formation may be degraded. When the flow rate of the $B_2H_6$ gas is lower than 1 sccm, the selective formation, which will be described later, cannot be achieved or sufficient film forming rate cannot be obtained.

For example, the flow rate of the $N_2$ gas controlled by each of the MFCs 312, 322 and 332 ranges from 1 sccm to 10,000 sccm, preferably from 1,000 sccm to 4,000 sccm. When the flow rate of the $N_2$ gas is higher than 10,000 sccm, the film forming rate may be excessively reduced or the uniformity of the film formation may be degraded. When the flow rate of the Ns gas is lower than 1 sccm, the uniformity of the film formation may be degraded.

For example, the duration of the exposure of the wafers 200 to the $B_2H_6$ gas, i.e. the time duration of supply of the $B_2H_6$ gas onto the wafers 200 ranges from 1 second to 60 seconds, preferably from 10 second to 30 seconds. When the time duration of supply of the $B_2H_6$ gas is longer than 60 seconds, the film-forming rate may be reduced. When the time duration of supply of the $B_2H_6$ gas is shorter than 1 second, the selective formation, which will be described later, cannot be achieved or sufficient film forming rate cannot be obtained. When the time duration of supply of the $B_2H_6$ gas is shorter than 1 second, $B_2H_6$ gas may not react with $WF_6$ gas sufficiently.

For example, the temperature of the heater 207 is controlled such that the temperature of the wafers 200 ranges from 150° C. to 300° C. preferably from 160° C. to 250° C. When the temperature of the wafers is higher than 300° C. selective formation may not be achieved. When the temperature of the wafers is lower than 150° C., reactivity is lowered, resulting in a failure to form the film.

By supplying the $B_2H_6$ gas to the wafers 200 under the above-described conditions, the boron-containing layer having a thickness of, for example, less than one molecular layer to several molecular layers is formed on the top surface of the wafers 200. The boron-containing layer may be a boron layer, an adsorption layer of $B_2H_6$, or both. Hereinafter, the adsorption layer of $B_2H_6$ may be referred to as "adsorption layer of the reducing agent." The boron-containing layer may be a continuous layer or a discontinuous layer containing boron. That is, the boron-containing layer may be a deposition layer containing boron having a thickness of, for example, less than one atomic layer to several atomic layers. The boron-containing layer may also contain hydrogen (H). The adsorption layer of the reducing agent may be a continuous layer or a discontinuous layer containing $B_2H_6$ molecules. That is, the adsorption layer of the reducing agent may be an adsorption layer containing $B_2H_6$ molecules having a thickness of, for example, less than one molecular layer to several molecular layers.

Herein, "layer having thickness of less than one molecular layer" indicates a molecular layer which is discontinuously formed, and "layer having thickness of one molecular layer" indicates a molecular layer which is continuously formed. The term "boron-containing layer" may also refer to both of the boron layer containing hydrogen and the adsorption layer of the reducing agent.

$B_2H_6$ adsorbed onto the wafer 200 reacts with $WF_6$ gas supplied in the second step to form a tungsten film on the wafer 200 according to the chemical reaction below. That is, hydrogen from $B_2H_6$ reacts with fluorine from $WF_6$ gas to generate hydrogen fluoride (HF), and boron from $B_2H_6$ reacts with fluorine from $WF_6$ gas to generate boron fluoride (boron trifluoride: $BF_3$) to replace $B_2H_6$ with tungsten.

$$B_2H_6+2WF_6 \rightarrow 2W+6HF+2BF_3$$

Figure 5:
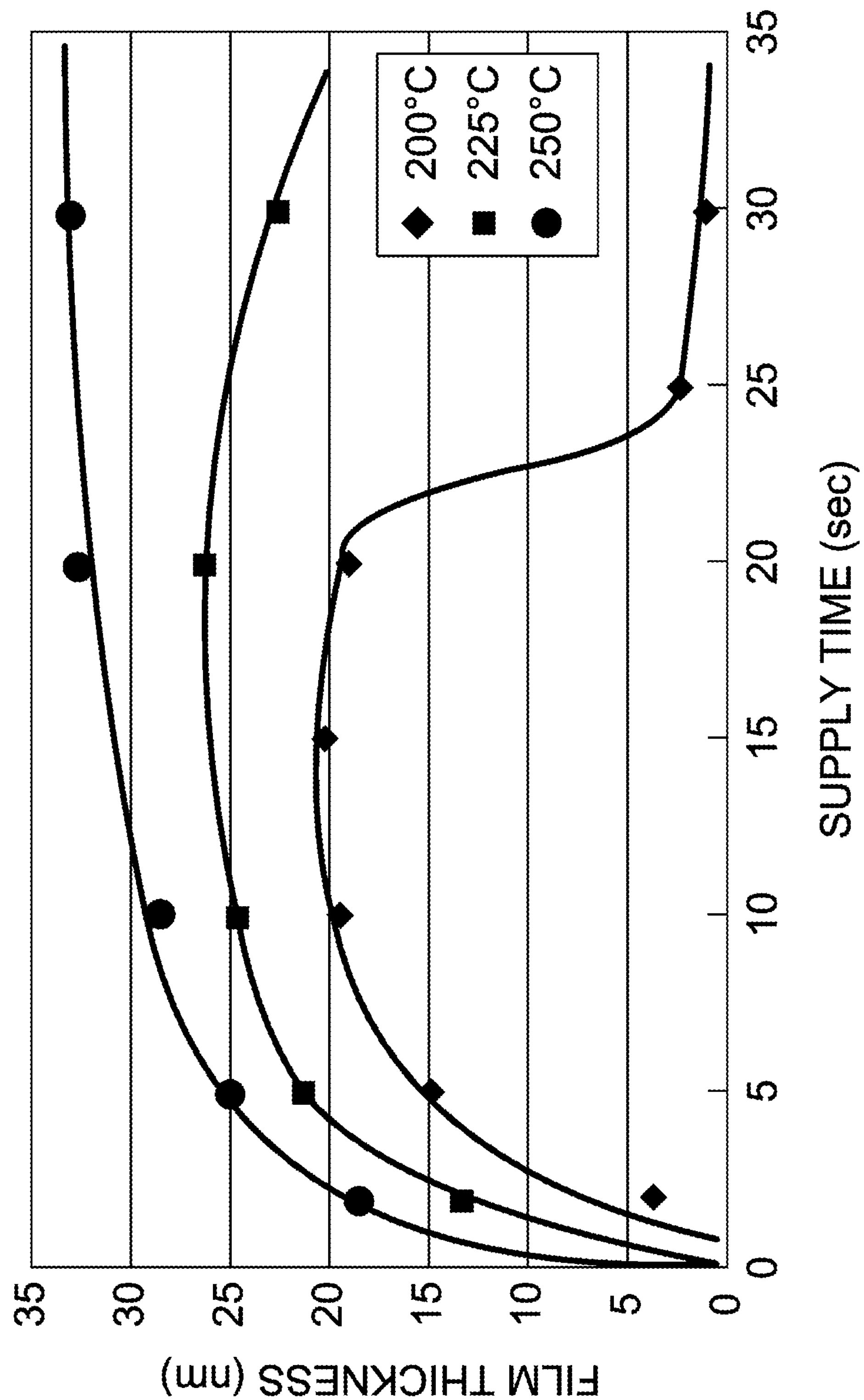
FIG. 5 is a graph illustrating the relationship between the thickness of a tungsten (W) film and a time duration of a supply of the $B_2H_6$ gas.

The relationship between the amount of $B_2H_6$ gas supplied and the amount of the tungsten film formed will be described with reference to FIG. 5. The vertical axis of the graph shown in FIG. 5 represents the thickness of the tungsten film, and the horizontal axis of the graph shown in FIG. 5 represents the time duration of the supply of the $B_2H_6$ gas. To verify the relationship between the amount of $B_2H_6$ gas supplied and the amount of the tungsten film formed, the inventors of the present application conducted experiments at 200° C. (denoted by ♦ in FIG. 5), 225° C. (denoted by ■ in FIG. 5) and 250° C. (denoted by ● in FIG. 5), and the amount of the tungsten film formed was compared. The film-forming sequence and the processing condition of the experiments are as follows:

The film-forming sequence: $[B_2H_6 \rightarrow WF_6] \times 100 \rightarrow W$;

The temperatures of the wafers 200: 200° C., 225° C., 250° C.;

The inner pressure of the process chamber 201: 500 Pa:

The flow rate of 5% $B_2H_6$ gas: 40 sccm;

The flow rate of $WF_6$ gas: 6 sccm; and

Base film: TiN.

Figure 6A:
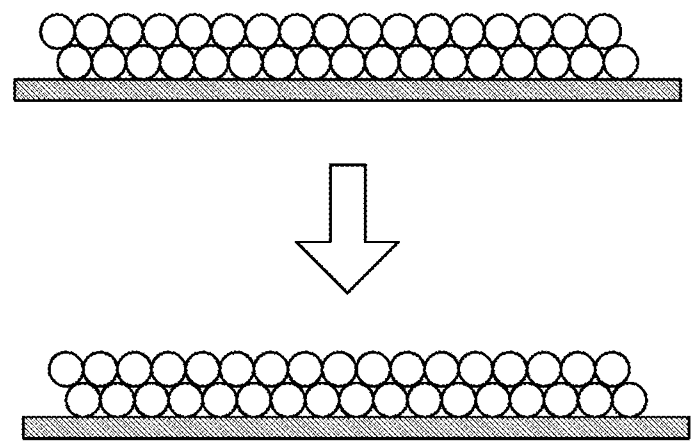
FIG. 6A is a diagram schematically illustrating a process in which a tungsten film is formed by adsorbing $B_2H_6$ by multiple layers.
Figure 6B:
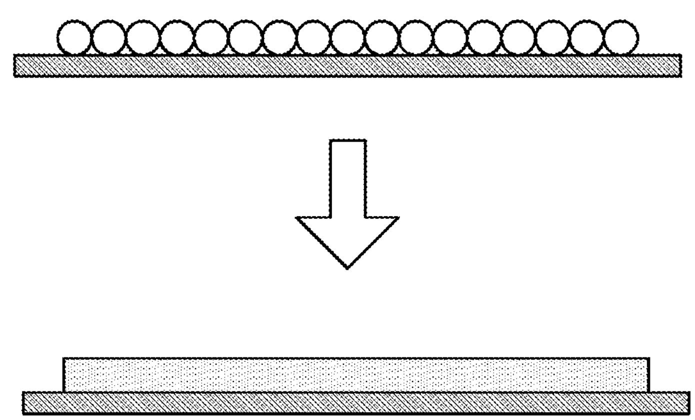
FIG. 6B is a diagram schematically illustrating a process in which a tungsten film is formed by adsorbing $B_2H_6$ per molecular layer.

According to the result of the experiments shown in FIG. 5, the thickness of the tungsten film tends to decrease from, a certain point of time when the time duration of supply of the $B_2H_6$ gas is extended in a low temperature range, for example, below 225° C. That is, even when the supplied amount of $B_2H_6$ gas is increased, the thickness of the tungsten film tends to decrease from a point of exceeding a certain amount. As shown in FIG. 5, while the tendency does not appears at 250° C., it is likely to appear when the time duration of the supply of the $B_2H_6$ gas is further extended. As schematically shown in FIG. 6A, when a large amount of $B_2H_6$ gas is supplied, $B_2H_6$ is adsorbed on the wafer to form multiple layers of $B_2H_6$ on the wafer. Since $WF_6$ gas does not react with multiple layers of $B_2H_6$ adsorbs to the wafer, tungsten film is not formed. As a result, the thickness of the tungsten film decreases. That is, when $B_2H_6$ is adsorbed on the wafer more than one molecular layer (multiple layers), the reaction of $B_2H_6$ between $WF_6$ gas does not occur resulting in a failure to form the tungsten film. On the other hand, as shown in FIG. 6B, when $B_2H_6$ is adsorbed on the wafer one molecule or less (unsaturated or saturated adsorption), the reaction between $B_2H_6$ and $WF_6$ gas occurs on the wafer. As a result, a tungsten film is formed. According to the embodiment, "saturated adsorption" refers to a state in which one molecular layer of $B_2H_6$ is adsorbed on a wafer. Increasing the partial pressure of $B_2H_6$ gas in the process chamber 201 or increasing the flow rate of $B_2H_6$ gas provides the same effect as extending the time duration of supply of the $B_2H_6$ gas or increasing the supplied amount of $B_2H_6$ gas. The same effect may be also obtained by adjusting the partial pressure of $B_2H_6$ gas (first reducing gas) and the time duration of supply of the $B_2H_6$ gas such that the product of the partial pressure of $B_2H_6$ gas and the time duration of supply of the $B_2H_6$ gas is equal to or greater than a predetermined value.

Figure 7:
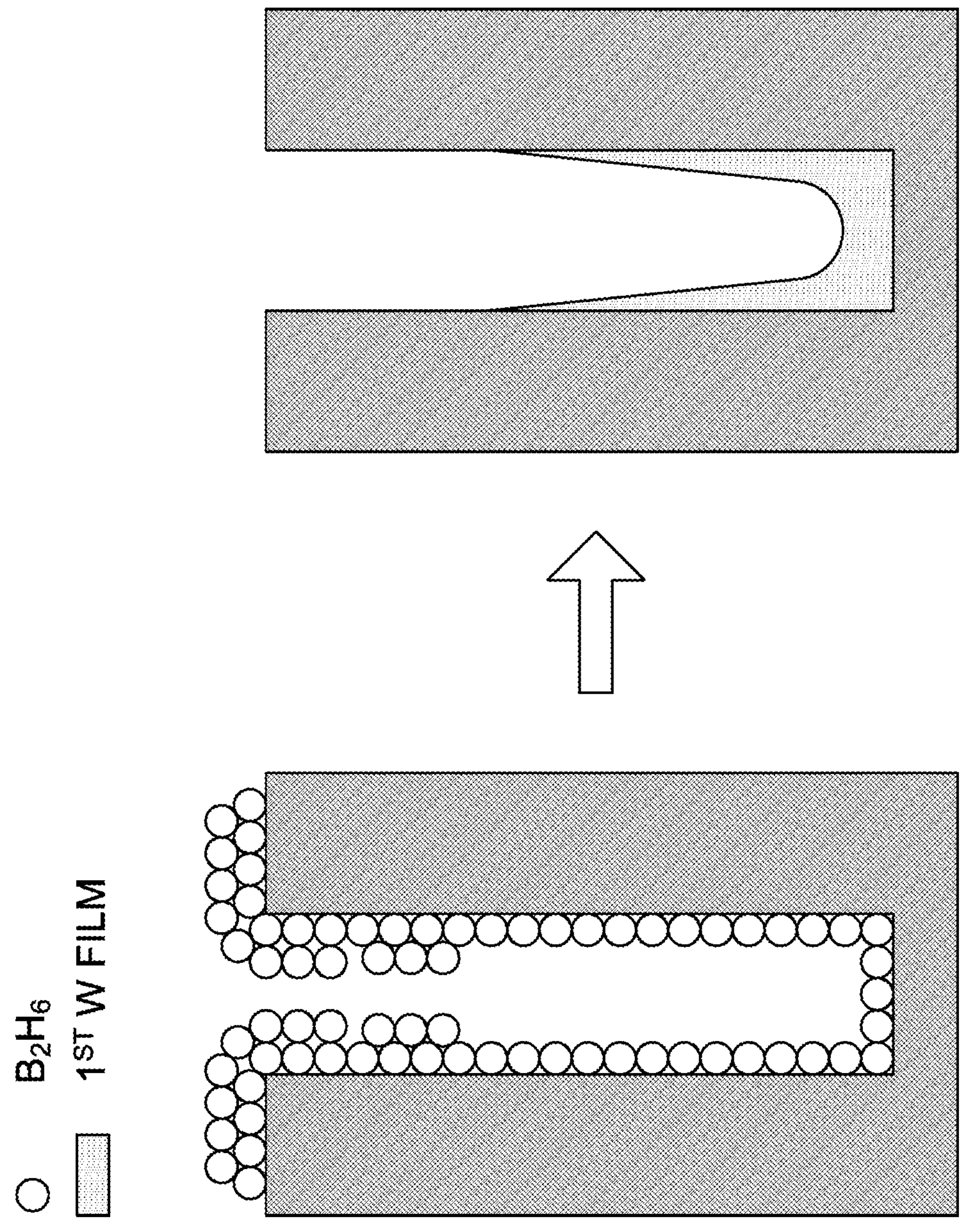
FIG. 7 is a diagram schematically showing a process in which a tungsten film is formed in a groove.

The inventors of the present application have confirmed that selective formation of the first tungsten film can be obtained by using the above-described phenomenon. That is, if was confirmed that the first tungsten film can be selectively formed in a desired region. As shown in FIG. 7, the amount of $B_2H_6$ gas supplied to an upper portion of the groove on the wafer 200 having a base film thereon is such that multiple layers of $B_2H_6$ is adsorbed to the upper portion of the groove, and the amount of $B_2H_6$ gas supplied to a lower portion of the groove on the wafer 200 having the base film thereon is such that one molecular layer of or less is adsorbed to the lower portion of the groove. As a result, the first tungsten film is selectively formed only on the lower portion of the groove but not on the upper portion of the groove. That is, the first tungsten film is selectively formed only at the lower portion of the groove while the base film at the upper portion of the groove exposed. This can be achieved by supplying greater amount of the $B_2H_6$ gas to the upper portion of the groove compared, to the lower portion of the groove. Herein, "lower portion of the groove" refers to a portion of the inside of the grove lower than the upper portion of the inside of the grove. The lower portion of the groove includes the bottom inner surface of the groove.

In order to form the first tungsten film is selectively only at the lower portion of the groove, the supplied amount of $B_2H_6$ gas is adjusted while having the supplied, amount of $B_2H_6$ in which $B_2H_6$ is saturately adsorbed to the lower portion of the groove as the upper limit (maximum). That is, when the amount $D_x$ is the supplied amount of $B_2H_6$ in which $B_2H_6$ is saturately adsorbed to the lower portion of the groove, the tungsten film is not formed when $B_2H_6$ gas is supplied to the wafer 200 greater than the amount $D_x$, and the tungsten film is not formed when $B_2H_6$ gas is supplied to the wafer 200 equal to or less than the amount $D_x$.

For example, by controlling the supply condition of the $B_2H_6$ gas to be within the ranges of the inner pressure of the process chamber 201, the flow rate and the time duration described above, the first tungsten film are selectively formed in the groove. The amount of $B_2H_6$ gas supplied should be changed according to the ratio of width to depth of the groove (aspect ratio). That is, the supply condition of the $B_2H_6$ gas such as the amount of $B_2H_6$ gas to be supplied is preferably determined by the aspect ratio. For example, for higher aspect ratio i.e. (for deeper grooves), the amount of $B_2H_6$ gas to be supplied should be increased.

<First Residual Gas Removing Step>

Next, the valve 514 is closed to stop the supply of the $B_2H_6$ gas. With the APC valve 245 of the exhaust pipe 231 open, the vacuum pump 246 vacuum-exhausts the inside of the process chamber 201 to remove residual $B_2H_6$ gas which did not react or contribute to the formation of the boron-containing layer or to remove the reaction by-products from the process chamber 201. By maintaining the valves 314, 324 and 334 open, $N_2$ gas is continuously supplied into the process chamber 201, $N_2$ gas acts as a purge gas, which improves the efficiency of removing the residual $B_2H_6$ gas which did not react or contribute to the formation of the boron-containing layer or removing the reaction by-products from the process chamber 201.

In first residual gas removing step, it is not necessary to completely discharge the gas remaining in the process chamber 201 and completely purge the process chamber 201. A small amount of gas remaining in the process chamber 201 does not adversely affect the subsequent second step. Therefore, it is not necessary to supply the $N_2$ gas at a large flow rate into the process chamber 201. The purge may be performed by supplying the $N_2$ gas of an amount equal to the volume of the reaction tube 203 (process chamber 201) such that the second step will not be adversely affected. By not completely purging the inside of the process chamber 201, the purging time may be shortened and the throughput may be improved. The consumption of the $N_2$ gas is also reduced to the minimum.

<Second Step>

After the first step is completed, $WF_6$ gas is supplied onto the wafers 200 in the process chamber 201 in the second step.

In the second step, the valve 514 is opened while the valves 524 and 534 are closed. The valves 314, 324 and 334 are controlled in the same manners as in the first step. The flow rate of the $WF_6$ gas is adjusted by the MFC 512, and the $WF_6$ gas with the flow rate thereof adjusted is supplied into the process chamber 201 onto the wafers 200 through the nozzle 410 and is then exhausted through the exhaust pipe 231.

Simultaneously, the APC valve 243 is controlled such that the inner pressure of the process chamber 201 ranges, for example, from 1 Pa to 1,000 Pa, preferably from 2 Pa to 800 Pa. When the inner pressure of the process chamber 210 is higher than 1,000 Pa, selective formation may not be achieved or a residual gas may not be sufficiently removed in a second residual gas removing step described later, thereby degrading the uniformity of the film formation. When the inner pressure of the process chamber 210 is lower than 1 Pa, selective formation may not be achieved, uniformity of the film formation is degraded, or the reaction rate of the $WF_6$ gas may not be sufficient.

For example, the flow rate of the $WF_6$ gas controlled, by the MFC 512 ranges from 1 sccm to 10,000 sccm, preferably from 100 sccm to 500 sccm. When the flow rate of the $WF_6$ gas is higher than 10,000 sccm, selective formation may not be achieved. Moreover, the residual gas may not be sufficiently removed at the second residual gas removing step described later. As a result, the uniformity of the film formation may be degraded. When the flow rate of the $WF_6$ gas is lower than 1 sccm, the uniformity of the film formation may be degraded, and the reaction rate of the $WF_6$ gas may not be sufficient.

For example, the flow rate of the $N_2$ gas controlled by each of the MFCs 312, 322 and 332 ranges from 1 sccm to 10,000 sccm, preferably from 1,000 sccm to 4,000 sccm, respectively. When the How rate of the $N_2$ gas is higher than 10,000 sccm, the uniformity of the film formation may be degraded, and the reaction rate of the $WF_6$ gas may not be sufficient. When the flow rate of the $N_2$ gas is lower than 1 sccm, selective formation may not be achieved. The residual gas may not be sufficiently removed at the second residual gas removing step described later. As a result, the uniformity of the film formation may be degraded.

For example, the duration of tire exposure of the wafers 200 to the $WF_6$ gas, i.e. the time duration of supply of the $WF_6$ gas onto the wafers 200 ranges from 1 second to 60 seconds, preferably from 10 second to 30 seconds. When the time duration of supply of the $WF_6$ gas is longer than 60 seconds, selective formation may not be achieved or the uniformity of the film formation may be degraded. When the time duration of supply of the $B_2H_6$ gas is shorter than 1 second, uniformity of the film formation may be degraded or the reaction rate of the $WF_6$ gas may not be sufficient.

The temperature of the heater 207 is controlled in the same manners as in the first step. Only the $WF_6$ gas and the $N_2$ gas are supplied into the process chamber 201. The first tungsten film having a thickness of, for example, less than one atomic layer to several atomic layers is formed at the lower portion of the wafer 200 by supplying the $WF_6$ gas. That is, the fluorine (F) from $WF_6$ gas reacts with the hydrogen (H) from $B_2H_6$ adsorbed on the wafer to be reduced to hydrogen fluoride (HF), and the boron (B) from $B_2H_6$ reacts with the fluorine front $WF_6$ gas to generate $BF_3$ which is separated, thereby substituting $B_2H_6$ with tungsten (W) to form the first tungsten film.

The first tungsten film includes a continuous layer or a discontinuous layer containing tungsten. That is, the first tungsten film may be a tungsten deposition layer containing tungsten basing a thickness of, for example, less than one atomic layer to several atomic layers.

<Second Residual Gas Removing Step>

After the first tungsten film is formed, the valve 514 is closed to stop the supply of the $WF_6$ gas. With the APC valve 243 of the exhaust pipe 231 open, the vacuum pump 246 vacuum-exhausts the inside of the process chamber 201 to remove residual $WF_6$ gas which did not react or contribute to the formation of the first tungsten film from the process chamber 201. That is, the residual $WF_6$ gas which did not react or contribute to the formation of the first tungsten film is removed from the space in which the wafers 200 are present. By maintaining the valves 314, 324 and 334 open, the $N_2$ gas is continuously supplied into the process chamber 201. $N_2$ gas acts as a purge gas, which improves the efficiency of removing the residual $WF_6$ gas which did not react or contribute to the formation of the first tungsten film from the process chamber 201.

Similar to the first residual gas removing step, it is not necessary to completely discharge the gas remaining In the process chamber 201 and completely purge the process chamber 201.

Instead of the $WF_6$ gas, a halogen-based titanium source gas such as tungsten hexachloride ($WCl_6$) gas and tungsten hexabromide ($WBr_6$) may be used as the source.

Instead of the tungsten-containing gas, a halogen-based metal source gas such as a gas containing metal element such as zirconium (Zr), hafnium (Hf), tantalum (Ta), niobium (Nb), molybdenum (Mo), titanium (T), yttrium (Y), strontium (Sr) and aluminum (Al) may also be used as the source.

For example, a chloro-based metal source gas such as zirconium tetrachloride ($ZrCl_4$) gas, hafnium tetrachloride ($HfCl_4$) gas, tantalum pentachloride ($TaCl_5$) gas, niobium pentachloride ($NbCl_5$) gas, molybdenum pentachloride ($MoCl_5$) gas, titanium tetrachloride ($TiCl_4$) gas, yttrium trichloride ($YCl_3$) gas, strontium dichloride ($SrCl_2$) gas and aluminum trichloride ($AlCl_3$) gas may also be used as the source.

For example, a fluoro-based metal source gas such as zirconium tetrafluoride ($ZrF_4$) gas, hafnium tetrafluoride ($HfF_4$) gas, tantalum pentafluoride ($TaF_5$) gas, niobium pentafluoride ($NbF_5$) gas, molybdenum hexafluoride ($MoF_6$) gas, titanium tetrafluoride ($TiF_4$) gas, yttrium trifluoride ($YF_3$) gas, strontium difluoride ($SrF_2$) gas and aluminum tri fluoride (($AlF_3$) gas may also be used as the source.

For example, a bromo-based metal source gas such as zircon suns tetrabromide ($ZrBr_4$) gas, hafnium tetrabromide ($HfBr_4$) gas, tantalum pentabromide ($TaBr_5$) gas, niobium pentabromide ($NbBr_5$) gas, titanium tetrabromide ($TiBr_4$), yttrium tribromide ($YBr_3$) gas, strontium dibromide ($SrBr_2$) gas and aluminum tribromide ($Albr_3$) gas may also be used as the source.

For example, an iodine-based metal source gas such as zirconium tetraiodide ($ZrI_4$) gas, hafnium tetraiodide ($HfI_4$) gas, tantalum pentaiodide ($TaI_5$) gas, niobium pentaiodide ($NbI_5$) gas, yttrium triiodide ($YI_3$) gas, strontium diiodide ($SrI_2$) gas and aluminum triiodide ($AlI_3$) may also be used as the source.

For example, a halogen-based semimetal source gas containing semimetal element such as silicon (Si), germanium (Ge), boron (B), antimony (Sb) and tellurium (Te) as main element may also be used as the source. For example, a halogen-based silicon source gas such as silicon tetrachloride ($SiCl_4$) gas, silicon tetrafluoride ($SiF_4$) gas, silicon tetrabromide ($SiBr_4$) gas and silicon tetraiodide ($SiI_4$) gas may also be used as the source. For example, a halogen-based boron source gas such as boron trichloride ($BCl_3$) gas, boron trifluoride ($BF_3$) gas, boron tribromide ($BBr_3$) gas and boron triiodide ($BI_3$) gas may also be used as the source.

For example, instead of the boron-containing gas, a silicon-containing gas (silane-based gas) such as monosilane ($SiH_4$) gas and disilane ($Si_2H_6$) gas may be used as the first reducing gas.

Instead of the $N_2$ gas, rare gases such as argon (Ar) gas, helium (He) gas, neon (Ne) gas and xenon (Xe) gas may be used as the inert gas.

<Performing Predetermined Number of Times>

By performing a cycle wherein the first step and the second step are performed non-simultaneously in order a predetermined number of times (one or more times), that is, by performing a cycle including the first step and the second step n times (wherein n is a natural number equal to or greater than one), the first tungsten film having a predetermined thickness is formed on the wafers 200. Herein, "performing a cycle (step or process) a predetermined number of times" refers to "performing a cycle (step or process) once or a plurality of times", "n" is selected according to the target thickness of the first tungsten film. That is, the number of times above-described process is performed is determined by the target thickness of the film. It is preferable that the cycle is performed a plurality of times.

<Second Sequence>

The second sequence for forming the second, tungsten film on the first tungsten film is performed.

In the second sequence, $WF_6$ gas and $H_2$ gas are, at least in part simultaneously, supplied onto the wafers 200 in the process chamber 201 as the source gas and the second reducing gas, respectively. However, FIG. 4 exemplifies a film-forming step wherein the entire supply of $WF_6$ gas and gas are simultaneously performed. That is, the supply of $WF_6$ gas to the wafers 200 and the supply of $H_2$ gas to the wafers 200 starts simultaneously and ends simultaneously.

Specifically, the valves 514 and 534 are opened simultaneously to supply $WF_6$ gas and $H_2$ gas into the gas supply pipes 510 and 530, respectively. After the flow rates of the $WF_6$ gas and the $H_2$ gas are adjusted by the MFCs 312 and 332, respectively, the $WF_6$ gas and the $H_2$ gas are supplied into the process chamber 201 onto the wafers 200 through the plurality of gas supply holes **410*a* of the nozzles 410 and the plurality of gas supply holes 420*a* of the nozzles 420, respectively, such that the surfaces of the wafers 200 are exposed to the $WF_6$ gas and the $H_2$ gas, and the $WF_6$ gas and the $H_2$ gas are then exhausted through the exhaust pipe 231. Simultaneously, the valves 314 and 334 are opened to supply $N_2$ gas into the gas supply pipes 310 and 330. After the flow rate of $N_2$ gas is adjusted by the MFCs 312 and 332, the $N_2$ gas is supplied along with the $WF_6$ gas or the $H_2$ gas into the process chamber 201, and then exhausted through the exhaust pipe 231. In order to prevent the $WF_6$ gas and the $H_2$ gas from entering the nozzle 420, the valve 324 may be opened to supply $N_2$ gas into the gas supply pipe 320. The $N_2$ gas is supplied into the process chamber 201 through the gas supply pipe 520 and the nozzle 420, and exhausted through the exhaust pipe 231**.

The APC valve 243 is controlled to adjust the inner pressure of the process chamber 201. For example, the inner pressure of the process chamber 201 ranges from 10 Pa to 1,300 Pa. For example, the flow rate of the $WF_6$ gas controlled by the MFC 512 ranges from 10 sccm to 1,000 sccm. For example, the flow rate of the $N_2$ gas controlled by the MFC 532 ranges from 100 sccm to 20.000 sccm. For example, the How rate of the gas controlled by each of the MFCs 312, and ranges from 10 sccm to 10,000 sccm, respectively. For example, the duration of the exposure of the waters 200 to the $WF_6$ gas or the $H_2$ gas, i.e. the time duration of supply of the $WF_6$ gas or the $H_2$ gas onto the wafers 200 ranges from 1 second to 1,000 seconds. For example, the temperature of the heater 207 is controlled such that the temperature of the wafers 200 ranges from room temperature to 250° C., preferably from 150° C. to 230° C. When the temperature of the wafers is lower than room temperature, energy required for forming the film may not be sufficient resulting in a failure to form the film.

The $WF_6$ gas and the $H_2$ gas supplied into the process chamber 201 react in the gas phase (gas phase reaction) on or above the surface of the wafers 200 to form the second tungsten film on the first tungsten film. Herein, the second tungsten film is a continuous film containing amorphous tungsten, a discontinuous film containing amorphous tungsten or stacked structures thereof. The tungsten film may contain fluorine from $WF_6$ molecule. By controlling (adjusting) the process conditions such as the flow rate and the duration of $WF_6$ gas and $H_2$ gas, the second tungsten film may be formed to have a desired thickness.

The inventors of the present application have found that the second tungsten film formed by the above-described film sequence at low temperature is formed only on the first tungsten film but not on the base film. That is, the formation of the second tungsten film is highly dependent upon the base film at low temperature. For example, the second tungsten film is not likely to be formed when the base film is a metal nitride film or an insulating film. Since the metal film contains more free electrons than the metal nitride film and the insulating film, the reaction is more likely to occur. Therefore, the second tungsten film is more likely formed when the base film is a metal film rather than a metal nitride film or an insulating film. Since the reactivity of the $WF_6$ gas is lowered at low temperature, the difference between the incubation time of the reaction between $WF_6$ gas and the insulating film and that of the $WF_6$ gas and the metal film increases. That is, the incubation time of the reaction between $WF_6$ gas and the insulating film is longer than that of the $WF_6$ gas and the metal film. Therefore, the second tungsten film is selectively formed only on the first tungsten film which is a metal film but not on the base film.

Figure 8A:
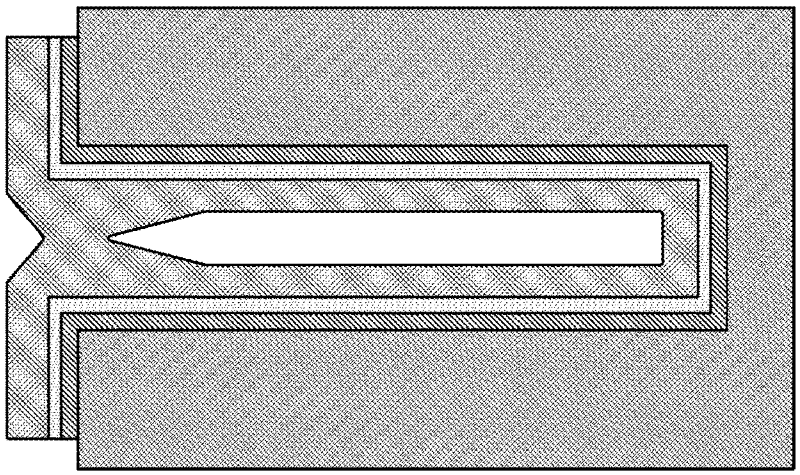
FIG. 8A illustrates a first tungsten film formed on the entire inner surface of the groove.

The inventors of the present application have found that selective formation of the second tungsten film is obtained by using the above-mentioned phenomenon. That is, it has been confirmed that the second tungsten film may be selectively formed on the first tungsten film. When the first tungsten film is present on the entire inner surface of the groove as shown in FIG. 8A, the second tungsten film is formed on the entire inner surface of the groove when filling the groove with the second tungsten film. As a result, a void may be formed at the center of the groove due to the coverage of the second tungsten film is degraded.

Figure 8B:
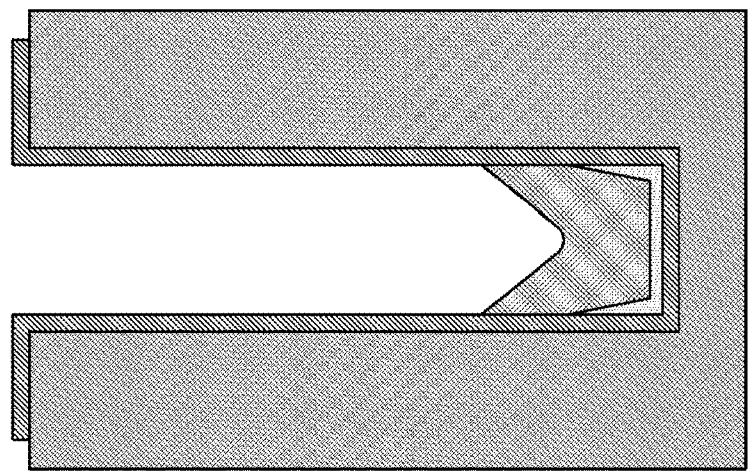
FIG. 8B illustrates a first tungsten film and a second tungsten film formed only on a lower portion of the groove.
Figure 8C:
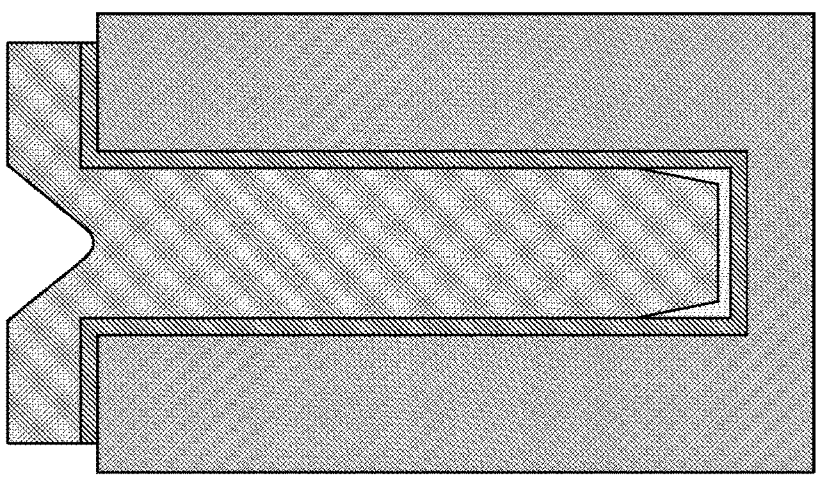
FIG. 8C illustrates a second tungsten film further formed on the structure shown in FIG. 8B.

On the other hand, when the first tungsten film is present only at the lower portion or the bottom of the groove with the base film at the upper portion of the grove exposed, the second tungsten film is formed only at lower portion or the bottom of the groove as shown in FIG. 8B. That is, the second tungsten film may be grown inside the groove from the bottom and up, which is referred to as "bottom-up film formation," rather than growing from the side wall of the groove. As a result, as shown in FIG. 8C, voids are not formed and the groove may be filled by the second tungsten film.

Instead of $H_2$ gas, a gas such as deuterium ($D_2$) gas free of other elements may also be used as the hydrogen-containing gas serving as the second reducing gas.

<Purging and Returning to Atmospheric Pressure Step>

After the film-forming process is completed, $N_2$ gas is supplied into the process chamber 201 through each of the gas supply pipes 310, 320 and 330, and then exhausted through the exhaust pipe 231. The $N_2$ gas sets as a purge gas. The process chamber 201 is thereby purged such that the gas or the reaction by-products remaining in the process chamber 201 are removed from the process chamber 201 (purging). Thereafter, the inner atmosphere of the process chamber 201 is replaced with the inert gas (substitution by inert gas), and the inner pressure of the process chamber 201 is returned to atmospheric pressure (returning to atmospheric pressure).

<Boat Unloading and Wafer Discharging Step>

Thereafter, the seal cap 219 is lowered by the boat elevator 115 and the lower end of the manifold 209 is opened. The boat 217 with the processed wafers 200 charged therein is unloaded from the reaction tube 203 through the lower end of the manifold 2093 (boat unloading). After the boat 217 is unloaded from the reaction tube 203, the processed wafers 200 are discharged from the boat 217 (wafer discharging).

(3) Effects of the Embodiment

One or more advantageous effects described below are provided according to the embodiment.

(a) By adjusting the amount of $B_2H_6$ gas supplied, the first tungsten film can be selectively formed in the groove.

It is confirmed by the inventors of the present application that the first tungsten film is not formed when the $B_2H_6$ gas is excessively supplied to the wafer 200 because the reaction with the $B_2H_6$ gas and the $WF_6$ gas does not occur. According to this embodiment, the first tungsten film can be selectively formed by adjusting the amount of $B_2H_6$ gas supplied such that fee amount of $B_2H_6$ gas supplied to a certain region of the groove is not excessive.

Specifically, by adjusting the amount of $B_2H_6$ gas supplied to the groove while having the amount of $B_2H_6$ is saturately adsorbed to the desired region of the groove as the upper limit $D_x$, the first tungsten film may be selectively formed in the desired region or may bit be formed in fee desired region.

(b) The second tungsten film can be selectively grown from the bottom of the groove by selectively forming the first tungsten film at the bottom of the groove with the base film at the upper portion the groove exposed. As a result, the filling properties of the second tungsten film are improved.

It is confirmed by the inventors of the present application that the second tungsten film is more likely formed on the first tungsten film which is a metal film rather than the base film which is a metal nitride film or an insulating film. If the first tungsten film is formed on the entire inner surface of the groove, the second tungsten film is also formed on the entire inner surface of the groove such that the upper portion of the groove is closed by the second tungsten film before the groove is filled by the second tungsten film since the film forming rate of the second tungsten film at the upper portion of the groove is hi dies than the film forming rate of the second tungsten film at the lower portion of the groove. As a result, a void is formed in the groove. If the first tungsten film is selectively formed only at the lower portion or the bottom of the groove rather than the entire inner surface of the groove, the second tungsten film is only formed at the lower portion or the bottom of the groove where the first tungsten film formed but not at the upper part of the groove where the base film is exposed. As a result, the second tungsten film is formed from the bottom and up and the groove is filled without voids.

(c) By filling the grooves using the first tungsten film and the second tungsten film, a tungsten film with superior filling properties and low electrical resistivity can be formed.

The filling properties of the first tungsten film are superior to those of the second tungsten film. That is, since the step coverage of the first tungsten film is superior to that of the second tungsten film, voids are less likely to be formed in first tungsten film. However, the electrical resistivity of the first tungsten film is higher than that of the second tungsten film. Therefore, by combining the first tungsten film and the second tungsten film, the tungsten film with both of the advantages including superior filling properties of the first tungsten film and the low electrical resistivity of the second tungsten film is obtained.

Specifically, by forming the first tungsten film at the lower portion of the groove and the second tungsten film on the first tungsten film, a tungsten film with excellent filling properties and low electrical resistivity is formed. By adjusting the thickness of the first tungsten film and the thickness of the second tungsten film, the electrical resistivity of the tungsten film can be controlled.

The above-described advantageous effects may also be obtained when the boron-containing gas other than the $B_2H_6$ gas is used as the reducing gas, or the halogen-based source gas other than the $WF_6$ gas is used as the source. The above-described advantageous effects may also be obtained when the halogen-based source gas used in the first sequence and the halogen-based source gas used in the second sequence are different. For example, in case the first tungsten film and the second tungsten film are formed according the above film-forming sequence using $WF_6$ gas as the first source in first sequence and $WCl_6$ as the second source in die second sequence, the above-described advantageous effects may also be obtained.

(4) Modified Examples

The film-forming sequence according to the embodiment is not limited the example shown in FIG. 4. The film-forming sequence may be modified as in the modified examples described below.

First Modified Example

In the first sequence for forming the first tungsten film, the amount of the reducing gas supplied in the first step may be varied per cycle.

Figure 9:
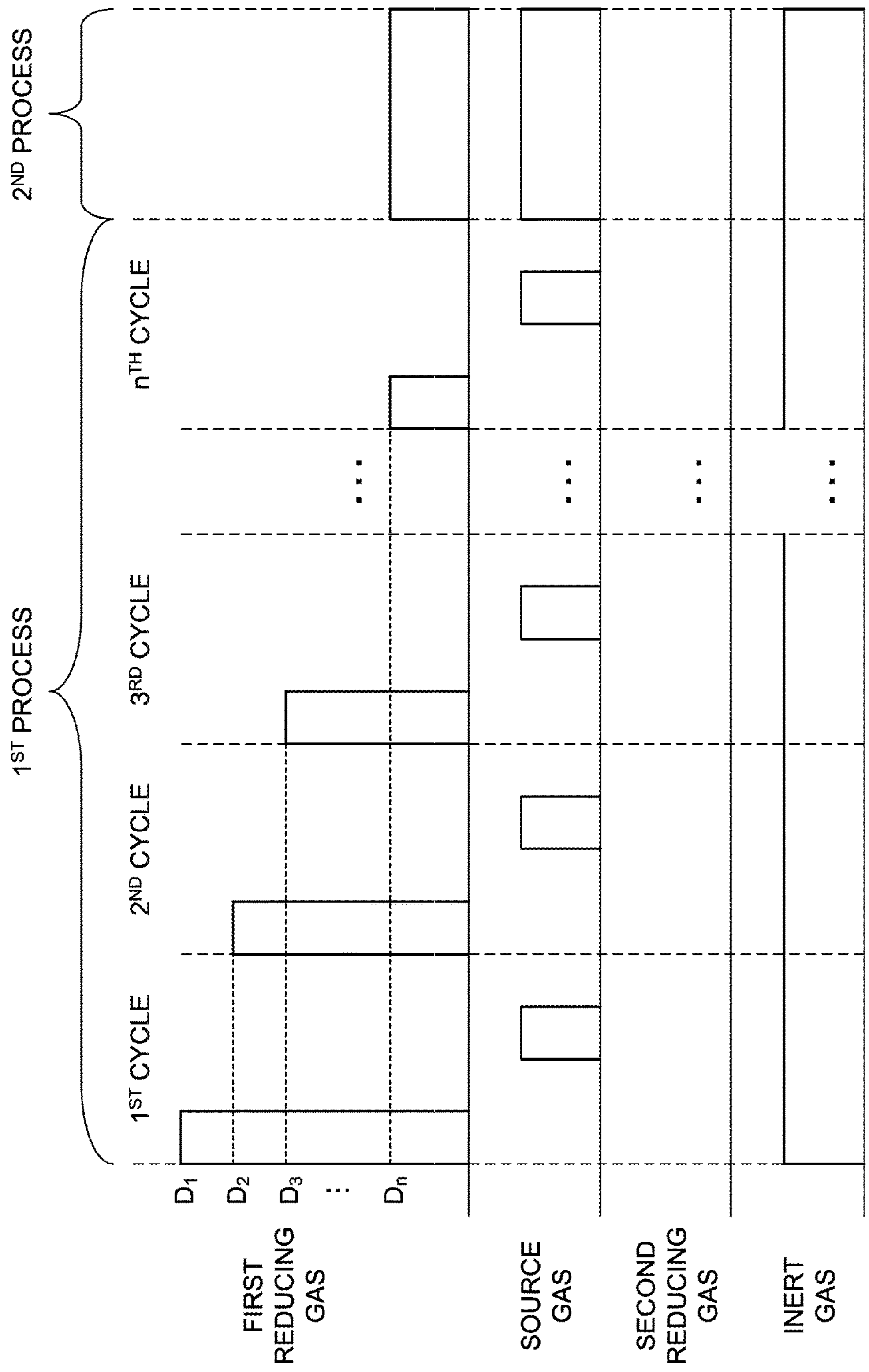
FIG. 9 is a diagram illustrating the tinting and the amount of a first reducing gas supplied in the film-forming process according to a modified example of the embodiment.

For example, the amount of the first reducing gas supplied may be changed per cycle. FIG. 9 illustrates example in which the amount of the first reducing gas is reduced for each cycle.

According to the first modified example, the same advantageous effects as those of the film-forming sequence shown in FIG. 4 are provided.

Figure 10:
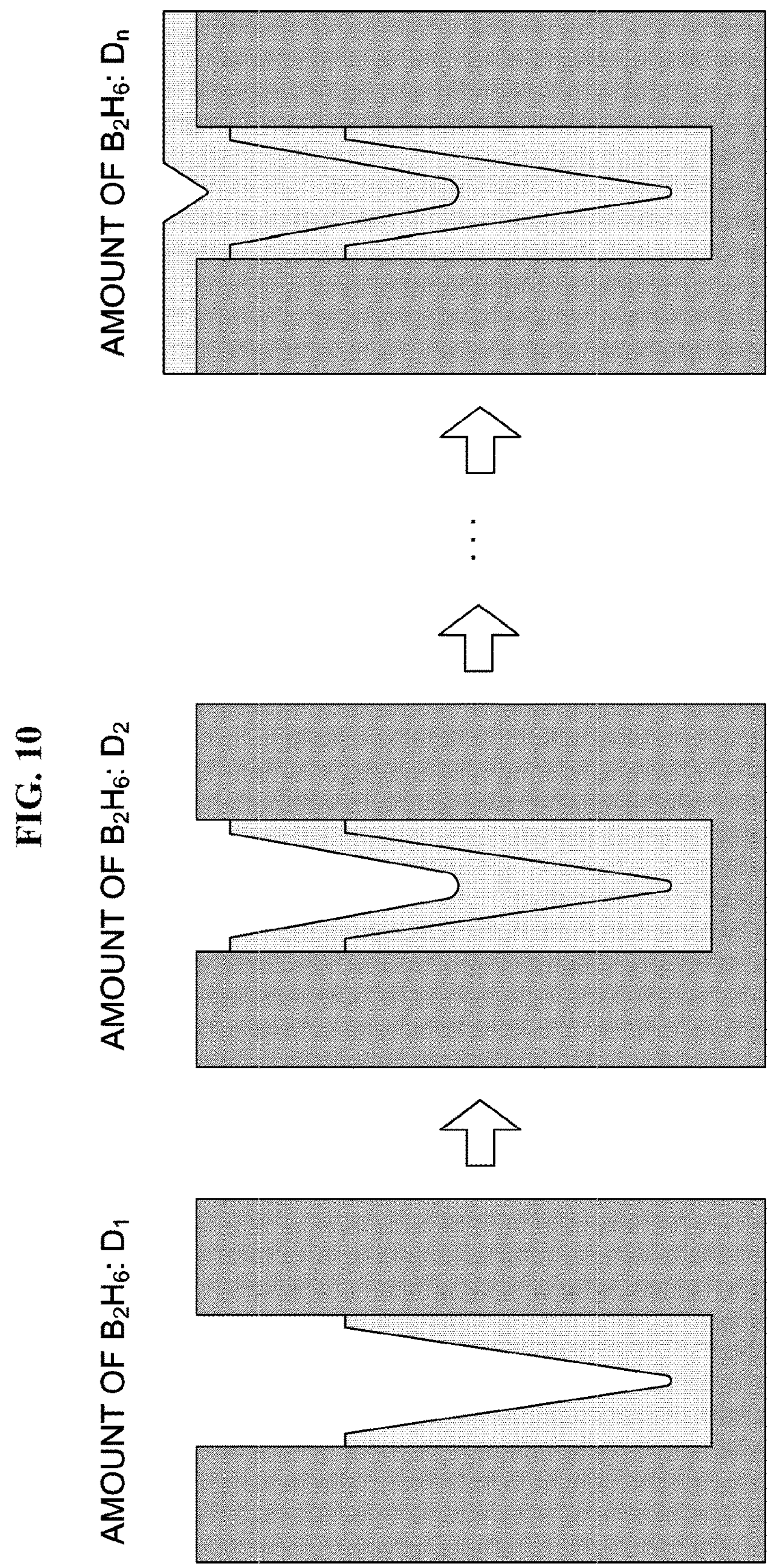
FIG. 10 illustrates a process of forming a tungsten film according to the modified example.

According to the first modified example, the groove may be filled with only the first tungsten film by varying the amount of $B_2H_6$ gas (first reducing, gas) supplied to the groove per cycle. For example, if the amounts of $B_2H_6$ gas supplied in cycles are $D_1, D_2, D_3, \ldots, D_n$, respectively, the amount of $B_2H_6$ gas supplied may be gradually decreased to satisfy $D_1>D_2>D_3> \ldots >D_n$ as the cycle is repeated from the beginning to the end of the film-forming process as shown in FIG. 10 to form the first tungsten film gradually from the bottom of the groove and up. As a result, the groove can be filled with the first tungsten film without voids.

According to another modified example, the amount of $B_2H_6$ gas supplied to the groove may be decreased as the cycle is performed. According to the another modified example, the same advantageous effects as those of the film-forming sequence shown in FIG. 9 are obtained.

According to another variant, for example, the supplied amount of $B_2H_6$ gas may be reduced each time a plurality of cycles is performed. According to the invention, the same advantageous effects as those of the film-forming sequence shown in FIG. 9 are obtained.

Other Embodiments

While the technique is described by way of the above-described embodiment, the above-described technique is not limited thereto. The above-described technique may be modified in various ways without departing from the gist thereof.

While the source gas is supplied after the first reducing gas is supplied in the first step according to the above-described embodiment, the above-described technique is not limited thereto. The above-described technique may be applied when the order of the first reducing gas and the source gas is reversed. That is, the above-described technique may be applied when the first reducing gas is supplied after the source gas is supplied. By changing the order of the gases, the quality or the composition of the film may be changed.

While the above-described embodiment is described based on forming the second tungsten film on the first tungsten film, the above-described technique is not limited thereto. The above-described technique may also be applied to the formations of the metal nitride film such as a tungsten, nitride (WN) film on the first tungsten film. For example, the above-described technique may also be applied to the formations of a film such as tungsten nitride (WN) film on the wafers 200.

While $H_2$ gas is used as the second reducing gas according to the above-described embodiment, a nitriding agent (nitriding gas) such as $NH_3$ gas may be used instead of the second reducing gas to form the metal nitride film. For example, the tungsten nitride (WN) film may be formed on the first tungsten film as represented by the sequence below.

$$[WCl_6 \rightarrow NH_3] \times n \rightarrow WN$$

The processing sequences and the processing conditions of the film-forming process of the tungsten nitride film may be substantially the same as those of the film-forming process according to the embodiment or the modified examples. When the above-described technique is applied to the formation process of the tungsten nitride film, the same advantageous effects as the above-described embodiment or the modified examples may be obtained. That is, the above-described technique may be applied to the formation, process of the nitride film containing metal element.

Instead of the $NH_3$ gas, a hydrogen nitrate-based gas such as diazene ($N_2H_2$) gas, hydrazine ($N_2H_4$) gas and $N_3H_8$ gas may be used as the nitriding gas. In addition to the hydrogen nitrate-based gas, a gas containing an amine, i.e., an amine-based gas may also be used as the nitriding gas. Gases such as monomethyl amine ($CH_3NH_2$, abbreviated as MMA) gas, dimethyl amine ($(CH_3)_2NH$, abbreviated as DMA) gas, trimethyl amine ($(CH_3)_3N$, abbreviated as TMA) gas, monoethyl amine ($C_2H_5NH_2$, abbreviated as MEA) gas, diethyl amine ($(C_2H_5)_2NH$, abbreviated as DEA) gas and triethyl amine ($(C_2H_5)_3N$, abbreviated as TEA) gas may also be used as the nitriding gas. A gas containing an organic hydrazine compound, that is, an organic hydrazine-based gas may also be used as the nitriding gas. Gases such as monomethyl hydrazine ($(CH_3)HN_2H_2$, abbreviated as MMH) gas, dimethylhydrazine ($(CH_3)_2N_2H_2$, abbreviated as DMH) gas and trimethyl hydrazine ($(CH_3)_2N_2(CH_3)H$, abbreviated as TMH) gas may also be used as the organic hydrazine-based gas.

The recipe used for substrate processing (e.g., a program defining the process sequences and process conditions of the substrate processing) is preferably prepared individually according to the processing contents such as type of film to be formed, composition ratio of the film, the quality the film, the thickness of the film, the process sequences and process conditions, and is stored in the memory device 121*c* via an electric communication line or the external memory device 123. When starting the substrate processing, the CPU 121*a* preferably selects an appropriate recipe among the plurality of recipe stored in the memory device 121*c* according to the contents of the substrate processing. Thus, various films having different composition ratios, different qualities and different thicknesses may be formed at high reproducibility using a single substrate processing apparatus. Further, since the burden on the operator such as inputting the processing sequences and the processing conditions may be reduced, various processes may be performed quickly while avoiding a malfunction of the apparatus.

The above-described recipe is not limited to creating a new recipe. For example, the recipe may be prepared by changing an existing recipe stored in the substrate processing apparatus in advance. When changing the existing recipe to a new recipe, the new recipe may be installed in the substrate processing apparatus via the telecommunication line or the recording medium in which the new recipe is stored. The existing recipe already stored in the substrate processing apparatus may be directly changed to a new recipe by operating the input/output device 122 of the substrate processing apparatus.

While a batch type substrate processing apparatus capable of simultaneously processing a plurality of substrates to form the film is exemplified in the above-described embodiment, the above-described technique is not limited thereto. For example, the above-described technique may be applied to the film formation using a substrate processing apparatus capable of processing a single substrate. While a substrate processing apparatus having hot wall type processing furnace is exemplified in the above-described embodiment, the above-described technique is not limited thereto. For example, the above-described technique may be applied the film format ion using a substrate processing apparatus having cold wall type processing furnace. The film formation may be performed according to the processing sequences and the processing conditions same as those of the above-described embodiments and modified examples using these substrate processing apparatuses.

Figure 11:
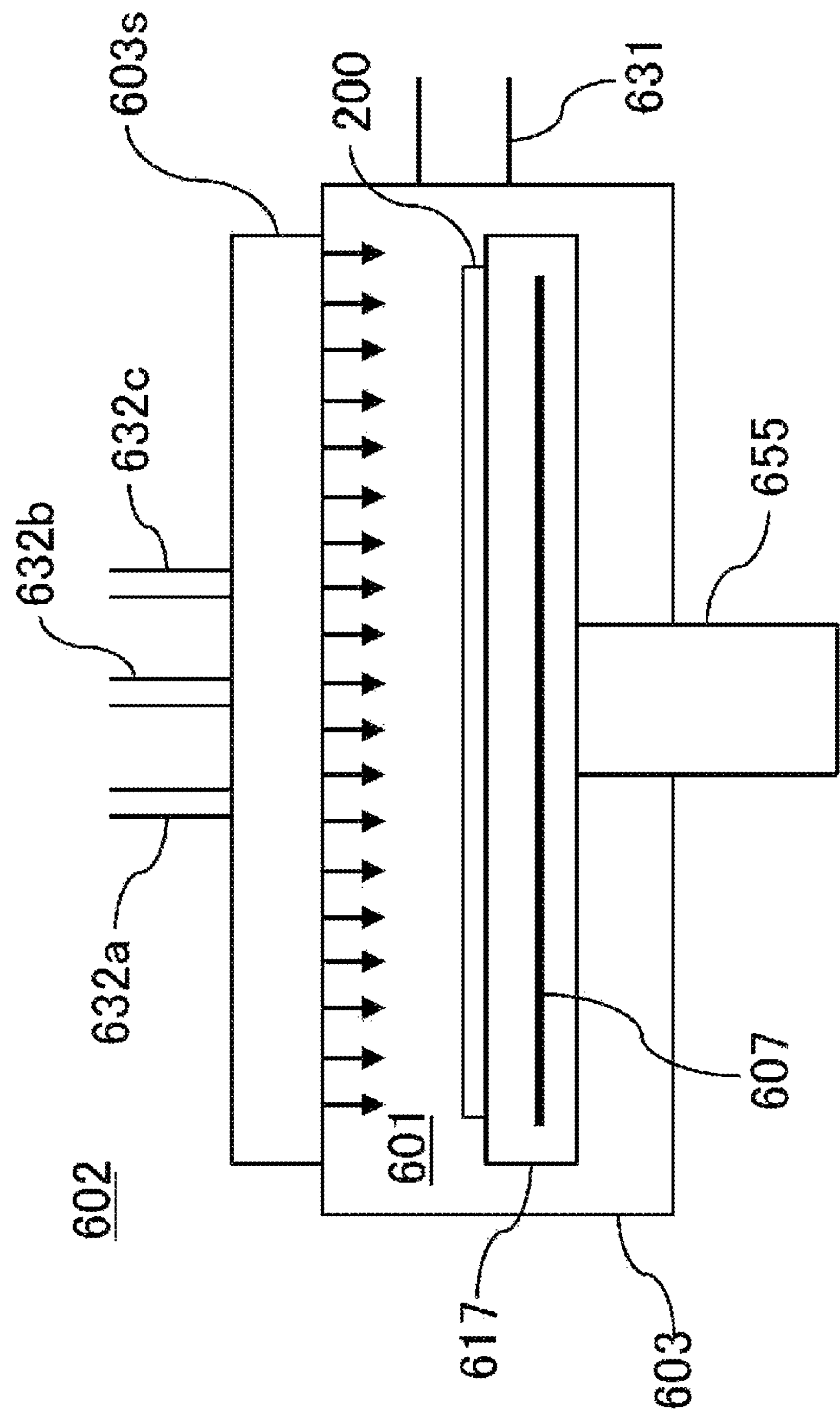
FIG. 11 schematically illustrates a vertical cross-section of a processing furnace of a substrate processing apparatus preferably used in another embodiment described herein.

For example, the above-described technique may be applied to the film formation using a single type substrate processing apparatus including a processing furnace 602 shown in FIG. 11. The processing furnace 602 includes: a processing vessel 603 defining a process chamber 601; a shower head (gas supply unit) 603*s* configured to shower the gas into the process chamber 601; a support table 617 horizontally supporting one or more wafers 200; a rotating shaft 655 supporting the support table 617 from thereunder; and a heater 607 provided in the support table 617. Gas supply ports 632*a*, 632*b* and 632*c* are connected, to an inlet (gas inlet) of the showerhead 603*s*. A gas supply system similar to the source supply system of the above-described embodiment is connected to the gas supply port 632*a*. A gas supply system similar to the first reducing gas supply system of the above-described embodiment is connected to the gas supply port 632*b*. A gas supply system similar to the second reducing gas supply system of the above-described embodiment is connected to the gas supply port 632*c*. A gas distribution plate (not shown) for showering the gas into the process chamber 601 is provided at an outlet (gas outlet) of the showerhead 603*s*. The showerhead 603*s* is provided at a location facing the surface of the wafers 200 loaded in the process chamber 601. An exhaust port 631 for exhausting the inner atmosphere of the processing chamber 601 is provided in the processing vessel 603. An exhaust system similar to that of the above-described embodiment is connected to the exhaust port 631.

Figure 12:
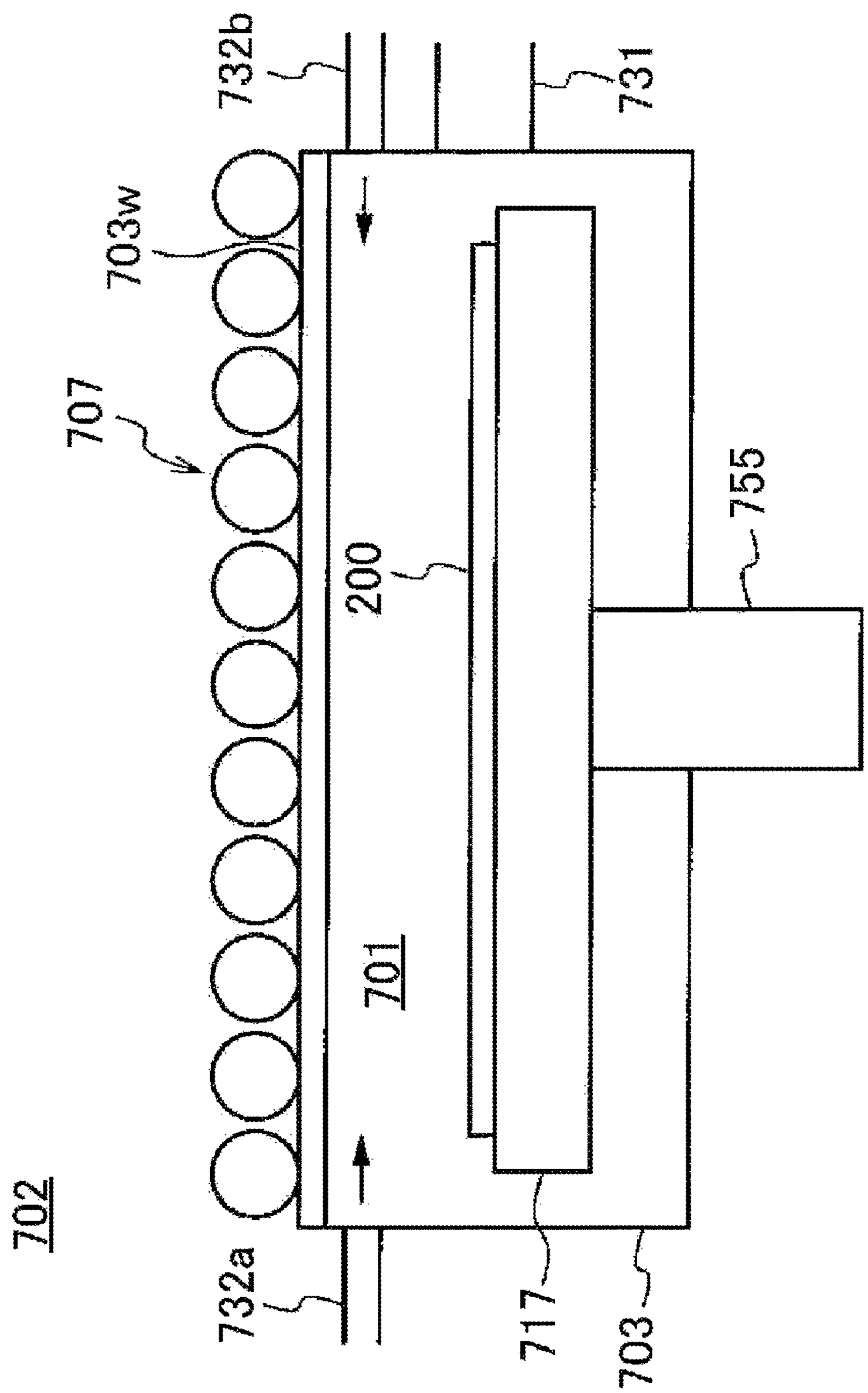
FIG. 12 schematically illustrates a vertical cross-section of a processing furnace of a substrate processing apparatus preferably used in yet another embodiment described herein.

For example, the above-described technique may be applied to the film formation using a substrate processing apparatus including a processing furnace 702 shown in FIG. 12. The processing furnace 702 includes: a processing vessel 703 defining a process chamber 701; a support table 717 horizontally supporting one or more wafers 200; a rotating shaft 755 supporting the support table 717 from thereunder; a lamp heater 707 configured to irradiate light onto the wafer 200 in the processing vessel 703; and a quartz window 703*w* for transmitting the light of the lamp heater 707. Gas supply ports 732*a* and 732*b* are connected to the processing vessel 703. A gas supply system similar to that of the source supply system of the above-described embodiment is connected to the gas supply port 732*a*. A gas supply system similar to the first reducing gas supply system of the above-described embodiment and a gas supply system similar to the second reducing gas supply system of the above-described embodiment are connected to the gas supply port 732*b*. An exhaust port 731 for exhausting the inner atmosphere of the processing chamber 701 is provided in the processing vessel 703. An exhaust system similar to the exhaust system of the above-described embodiment is connected to the exhaust port 731.

The lamp heater 707 may include, for example, a mercury lamp that generates ultraviolet (UV) light using the bright light emission of mercury. The lamp heater 707 may include a lamp coated with amalgam, which is an alloy of mercury and metal, inside a quartz tube. The lamp heater 707 may include a plurality of straight tube mercury lamps arranged in parallel, a plurality of U-shaped mercury lamps arranged in parallel, and a horseshoe shaped mercury lamp.

The film formations using the substrate processing apparatus including the processing furnace 602 and the substrate processing apparatus including the processing furnace 702 may be performed according to the processing sequences and the processing conditions same as those of the above-described embodiments and modified examples, and the same advantageous effects may be obtained.

The above-described embodiments and the modified examples may be appropriately combined. The processing sequences and the processing conditions of the combinations may be substantially the same as those of the above-described embodiment.

According to the technique described herein, the film having excellent step coverage and superior filling properties may be formed.

What is claimed is:

1. A method of manufacturing a semiconductor device, comprising:

(a) preparing a substrate provided with a groove having thereon a base film selected from a group consisting of a metal nitride film and an insulating film; and (b) performing a cycle a predetermined number of times to selectively form a first metal film at a lower portion of the groove with the base film at an upper portion of the groove exposed, the cycle comprising: (b-1) supplying a first reducing gas to the substrate; and (b-2) supplying a first metal-containing gas to the substrate, wherein (b-1) and (b-2) are non-simultaneously performed, and a supply condition of the first reducing gas in (b-1) is adjusted according to an aspect ratio of the groove.

2. The method of claim 1, wherein the supply condition of the first reducing gas in (b-1) is adjusted such that an amount of the first reducing gas supplied to the upper portion is greater than that of the first reducing gas supplied, to the lower portion.

3. The method of claim 2, wherein the amount of the first reducing gas supplied to the upper portion is greater than that of the first reducing gas which saturates an adsorption of the first reducing gas to the upper portion.

4. The method of claim 1, wherein the supply condition of the first reducing gas in (b-1) is adjusted such that the first metal-containing gas reacts with an adsorption layer of the first reducing gas formed at the lower portion exclusive of the adsorption layer formed at the upper portion.

5. The method of claim 1, wherein the supply condition of the first reducing gas comprises at least one of a flow rate, a duration of a supply and a partial pressure of the first reducing gas, and at least one of the flow rate, the duration and the partial pressure is decreased as the cycle is repeated.

6. The method of claim 1, wherein the supply condition of the first reducing gas comprises at least one of a duration of a supply and a partial pressure of the first reducing gas, and at least one of the duration and the partial pressure is adjusted such that a product of the duration and the partial pressure is equal to or higher than a predetermined value.

7. The method of claim 1, wherein (b-1) and (b-2) are alternately performed in (b).

8. The method of claim 1, wherein a temperature of the substrate ranges from room temperature to 250° C.

9. The method of claim 1, further comprising: (c) simultaneously supplying a second metal-containing gas and a second reducing gas to the substrate provided with the groove having the first metal film formed at the lower portion of the groove with the base film at the upper portion of the groove exposed to form a second metal film on the first metal film exclusive of the base film.

10. The method of claim 9, wherein the first metal-containing gas is same as the second metal-containing gas.

11. The method of claim 9, wherein the first reducing gas differs from the second reducing gas.

12. The method of claim 9, wherein an electrical resistivity of the second metal film is lower than that of the first metal film.

* * * * *